(12) United States Patent
Quisenberry et al.

(10) Patent No.: US 7,305,843 B2
(45) Date of Patent: Dec. 11, 2007

(54) HEAT PIPE CONNECTION SYSTEM AND METHOD

(75) Inventors: Tony Quisenberry, Highland Village, TX (US); Clark R. Havis, Roundrock, TX (US)

(73) Assignee: Thermotek, Inc., Carrollton, TX (US)

( * ) Notice: Subject to any disclaimer, the term of this patent is extended or adjusted under 35 U.S.C. 154(b) by 284 days.

(21) Appl. No.: 10/998,198

(22) Filed: Nov. 26, 2004

(65) Prior Publication Data

US 2005/0274120 A1    Dec. 15, 2005

Related U.S. Application Data

(63) Continuation-in-part of application No. 09/328,183, filed on Jun. 8, 1999, now Pat. No. 6,935,409.

(60) Provisional application No. 60/525,244, filed on Nov. 25, 2003.

(51) Int. Cl.
*F25B 21/02* (2006.01)
*F25D 23/12* (2006.01)
*F28D 15/00* (2006.01)

(52) U.S. Cl. .......................... 62/259.2; 62/3.7; 62/3.3; 165/104.21

(58) Field of Classification Search .................. 62/3.3, 62/3.7, 259.2; 165/104.21
See application file for complete search history.

(56) References Cited

U.S. PATENT DOCUMENTS

| | | | |
|---|---|---|---|
| 3,528,494 A | 9/1970 | Levedahl | |
| 4,072,188 A | 2/1978 | Wilson et al. | |
| 4,196,504 A | 4/1980 | Eastman | |
| 4,279,294 A | 7/1981 | Fitzpatrick et al. | |
| 4,280,519 A | 7/1981 | Chapman | |
| 4,381,032 A | 4/1983 | Cutchaw | |
| 4,470,450 A | 9/1984 | Bizzell et al. | |
| 4,503,906 A | 3/1985 | Andres et al. | |
| 4,550,774 A | 11/1985 | Andres et al. | |
| 4,558,395 A | 12/1985 | Yamada et al. | |
| 4,640,347 A | 2/1987 | Grover et al. | |
| 4,675,783 A | 6/1987 | Murase et al. | |
| 4,729,060 A | 3/1988 | Yamamoto et al. | |

(Continued)

FOREIGN PATENT DOCUMENTS

DE        1284506        12/1968

(Continued)

OTHER PUBLICATIONS

Andre Ali et al.; "Advanced Heat Pipe Thermal Solutions for Higher Power Notebook Computers"; Intel Corporation, Santa Clara, CA 1999; Thermacore, Inc. Lancaster, PA 1999; 6 pages.

(Continued)

*Primary Examiner*—Edward K. Look
*Assistant Examiner*—B. Clayton McGraw
(74) *Attorney, Agent, or Firm*—Winstead PC

(57) ABSTRACT

A stackable heat transfer system incorporating a plurality of flow controlled endcaps facilitating select flow of heat transfer fluid through low profile extrusions. The low profile extrusions are mounted in a sandwiched configuration with thermal electric cooling arrays for providing heat dissipation from the cooler arrays and the heat transfer from a low profile extrusion sandwiched the cooler arrays.

12 Claims, 18 Drawing Sheets

U.S. PATENT DOCUMENTS

| | | |
|---|---|---|
| 4,830,100 A | 5/1989 | Kato et al. |
| 4,854,377 A | 8/1989 | Komoto et al. |
| 4,880,052 A | 11/1989 | Meyer, IV et al. |
| 4,880,053 A | 11/1989 | Sheyman |
| 4,884,630 A | 12/1989 | Nelson et al. |
| 4,896,716 A | 1/1990 | Sotani et al. |
| 4,909,315 A | 3/1990 | Nelson et al. |
| 4,921,041 A | 5/1990 | Akachi |
| 4,982,274 A | 1/1991 | Murase et al. |
| 5,002,122 A | 3/1991 | Sarraf et al. |
| 5,005,640 A | 4/1991 | Lapinski et al. |
| 5,036,384 A | 7/1991 | Umezawa |
| 5,044,429 A | 9/1991 | Sakaya et al. |
| 5,054,296 A | 10/1991 | Sotani et al. |
| 5,069,274 A | 12/1991 | Haslett et al. |
| 5,076,351 A | 12/1991 | Munekawa et al. |
| 5,084,966 A | 2/1992 | Murase |
| 5,099,311 A | 3/1992 | Bonde et al. |
| 5,139,546 A | 8/1992 | Novobilski |
| 5,159,529 A | 10/1992 | Lovgren et al. |
| 5,168,921 A | 12/1992 | Meyer, IV |
| 5,186,252 A | 2/1993 | Nishizawa et al. |
| 5,199,487 A | 4/1993 | DiFrancesco et al. |
| 5,203,399 A | 4/1993 | Koizumi |
| 5,283,464 A | 2/1994 | Murase |
| 5,283,715 A | 2/1994 | Carlsten et al. |
| 5,285,347 A | 2/1994 | Fox et al. |
| 5,314,010 A | 5/1994 | Sakaya et al. |
| 5,316,077 A | 5/1994 | Reichard |
| 5,336,128 A | 8/1994 | Birdsong |
| 5,342,189 A | 8/1994 | Inamura et al. |
| 5,353,639 A | 10/1994 | Brookins et al. |
| 5,355,942 A | 10/1994 | Conte |
| 5,388,635 A | 2/1995 | Gruber et al. |
| 5,409,055 A | 4/1995 | Tanaka et al. |
| 5,465,780 A | 11/1995 | Muntner et al. |
| 5,465,782 A | 11/1995 | Sun et al. |
| 5,535,816 A | 7/1996 | Ishida |
| 5,555,622 A | 9/1996 | Yamamoto et al. |
| 5,567,493 A | 10/1996 | Imai et al. |
| 5,598,632 A | 2/1997 | Camarda et al. |
| 5,615,086 A | 3/1997 | Collins et al. |
| 5,636,684 A | 6/1997 | Teytu et al. |
| 5,642,775 A | 7/1997 | Akachi |
| 5,651,414 A | 7/1997 | Suzuki et al. |
| 5,653,111 A * | 8/1997 | Attey et al. .................. 62/3.7 |
| 5,660,229 A | 8/1997 | Lee et al. |
| 5,675,473 A | 10/1997 | McDunn et al. |
| 5,682,748 A | 11/1997 | DeVilbiss et al. |
| 5,689,957 A | 11/1997 | DeVilbiss et al. |
| 5,690,849 A | 11/1997 | DeVilbiss et al. |
| 5,692,558 A | 12/1997 | Hamilton et al. |
| 5,697,428 A | 12/1997 | Akachi |
| 5,711,155 A | 1/1998 | DeVilbiss et al. |
| 5,727,619 A | 3/1998 | Yao et al. |
| 5,731,954 A | 3/1998 | Cheon |
| 5,737,186 A | 4/1998 | Fuesser et al. |
| 5,890,371 A | 4/1999 | Rajasubramanian et al. |
| 5,901,037 A | 5/1999 | Hamilton et al. |
| 5,901,040 A | 5/1999 | Cromwell et al. |
| 5,960,866 A | 10/1999 | Kimura et al. |
| 5,989,285 A | 11/1999 | DeVilbiss et al. |
| 6,032,726 A | 3/2000 | Wright et al. |
| 6,041,850 A | 3/2000 | Esser et al. |
| 6,058,712 A | 5/2000 | Rajasubramanian et al. |
| 6,072,697 A | 6/2000 | Garcia-Ortiz |
| 6,101,715 A | 8/2000 | Fuesser et al. |
| 6,148,906 A | 11/2000 | Li et al. |
| 6,293,333 B1 | 9/2001 | Ponnappan et al. |
| 6,302,192 B1 | 10/2001 | Dussinger et al. |
| 6,397,935 B1 | 6/2002 | Yamamoto et al. |
| 6,457,515 B1 | 10/2002 | Vafai et al. |
| 6,462,949 B1 | 10/2002 | Parish, IV et al. |
| 6,523,259 B1 | 2/2003 | Pinneo |
| 6,647,625 B2 | 11/2003 | Wang et al. |
| 6,679,316 B1 | 1/2004 | Lin et al. |
| 6,698,502 B1 | 3/2004 | Lee |
| 6,745,825 B1 | 6/2004 | Nakamura et al. |
| 6,795,310 B2 | 9/2004 | Ghosh |
| 6,810,946 B2 | 11/2004 | Hoang |
| 6,820,684 B1 | 11/2004 | Chu et al. |
| 6,828,675 B2 | 12/2004 | Memory et al. |
| 6,834,712 B2 | 12/2004 | Parish et al. |
| 6,935,409 B1 | 8/2005 | Parish IV et al. |
| 2002/0189793 A1 | 12/2002 | Noda et al. |
| 2003/0089486 A1 | 5/2003 | Parish et al. |
| 2003/0089487 A1 | 5/2003 | Parish IV et al. |
| 2003/0127215 A1 | 7/2003 | Parish IV et al. |
| 2004/0099407 A1 | 5/2004 | Parish IV et al. |
| 2004/0112572 A1 | 6/2004 | Moon et al. |
| 2004/0177947 A1 | 9/2004 | Krassowski et al. |
| 2005/0006061 A1 | 1/2005 | Quisenberry et al. |
| 2005/0039887 A1 | 2/2005 | Parish IV et al. |
| 2005/0056403 A1 | 3/2005 | Norlin et al. |

FOREIGN PATENT DOCUMENTS

| | | |
|---|---|---|
| DE | 3117758 | 1/1982 |
| DE | 8512617 | 9/1985 |
| DE | 19849919 | 5/1999 |
| GB | 334209 | 8/1930 |
| GB | 1402509 | 8/1975 |
| GB | 2128319 A | 4/1984 |
| GB | 2128320 A | 4/1984 |
| JP | 53136749 | 11/1978 |
| JP | 63115351 | 5/1988 |
| JP | 06291481 | 10/1994 |
| SU | 589531 | 1/1978 |
| SU | 1476297 | 4/1989 |
| WO | WO91/06958 | 5/1991 |
| WO | WO-95/26125 | 9/1995 |
| WO | WO-98/20260 | 1/1998 |
| WO | WO-99/42781 | 8/1999 |
| WO | WO-00/70288 | 11/2000 |
| WO | WO-01/03484 | 1/2001 |

OTHER PUBLICATIONS

Thermatex Inc; Setting a Higher Standard in Aluminum Extrusions'; Brochure undated; 8 pages.

"Furukawa Electric Heat Planar"; Brochure undated from Trade Show, Aug. 1999; 4 pages.

"Gore's POLARCHIP Thermal Interface Materials . . . Bridge the Gap Between Hot PCBs and Cool Heat Sinks."; W.L. Gore and Associates, Inc. 2000; 1 page.

"Thermal Managment Components To Fill Virtually Any Gap Configuration"; Stockewell Rubber Company; Nov. 2001.

U.S. Appl. No. 10/998,199, filed Nov. 26, 2004, Parish IV et al.

* cited by examiner

HEAT PIPE CONNECTION SYSTEM AND METHOD

CROSS-REFERENCES

This application claims priority to and incorporates by reference the entirety of U.S. Provisional Application Ser. No. 60/525,244 filed Nov. 25, 2003. This application is also a Continuation-in-Part of and incorporates by reference the entire disclosure of U.S. patent application Ser. No. 09/328,183 which was filed Jun. 8, 1999 now U.S Pat. No. 6,935,409. The present application also incorporates by reference the entire disclosure of U.S. patent application Ser. No. 10/305,662 which was filed Nov. 6, 2002. Related applications include U.S. patent application Ser. No. 10/328,537 which is a divisional of the above-referenced patent application Ser. No. 09/328,183. Other related applications include U.S. patent application Ser. No. 10/328,438 which is also a divisional of U.S. patent application Ser. No. 09/328,183 and U.S. patent application Ser. No. 10/335,373, a continuation-in-part of referenced application Ser. No. 09/328,183.

BACKGROUND OF THE INVENTION

1. Field of the Invention

The present invention relates to cooling systems, and more particularly, but not by way of limitation, to a cooling system incorporating flow coupling end caps for facilitating the flow-coupled stacking of low profile extrusions (LPE's).

2. History of Related Art

Many aspects of the technology of, and advances in, methods of and systems for cooling and heating utilizing heat pipes are well developed. A heat pipe is a device for transferring heat by means of the evaporation and condensing cycle of a heat transfer liquid enclosed in a casing from which noncondensable gasses have been removed. There are, of course, significant limitations on the amount of heat a heat pipe can transfer in a given time or in a given space even when the heat transfer liquid is pumped therethrough. In that regard, special configurations are often major design aspects in dealing with heat pipes and/or other forms of heating and/or cooling systems. In the present application, particular emphasis will be placed on heating systems, but the application of heating and/or cooling application is contemplated relative to discussions herein.

The need for thermal stabilization of electronic components is well recognized in industry today. In that regard, LPE cooling devices are extremely useful in printed circuit board (PCB) level cooling of electronic components, and for use as heat exchangers in applications where space is limited and/or low weight is critical. LPE refers to a heat exchange apparatus comprising an integral piece of metal having a series of micro extruded hollow tubes formed therein for containing a fluid. LPE's preferably have multi-void micro extruded tubes designed to operate under the pressures and temperatures required by modern environmentally safe refrigeration gases and to resist corrosion. Aspects of LPE's and their related applications in the industry are set forth and shown in the above-referenced co-pending U.S. patent application Ser. No. 09/328,183.

Low profile extrusions can currently be manufactured with a profile, or height, as low as about 0.05 inches and with tubes of varying inner diameters. Of course, future advances may allow such low profile extrusions to be manufactured with an even smaller profile. Such low profile extrusions have been conventionally used in heat exchanger applications in the automotive industry, and are commercially available in strip form (having a generally rectangular geometry) or coil form (a continuous strip coiled for efficient transport).

An example of a low profile extrusion is described in a brochure entitled "Thermalex, Inc.—Setting A Higher Standard in Aluminum Extrusions" (hereinafter the "Thermalex Brochure") provides additional detail regarding the Thermalex low profile extrusions and is incorporated herein by reference.

U.S. Pat. No. 5,342,189 to Inamura, et al, which is incorporated herein by reference, provides additional detail regarding an extrusion die for making such low profile extrusions. The extrusion die is used for making multi-cavity flat aluminum tubes, which are used for small heat exchanger components, in automotive air-conditioners, condensers, and radiators. The insert die is composed of a male die section having a protrusion part and a female die section, having a die cavity, and is held detachably in a die holder. The male section is a roughly rectangular plate-shaped component, and has an integrally formed twist prevention region which is inserted into the receiver groove of the female section which is integrally formed thereon. The protrusion part defines the cavity shape of the multi-cavity flat tube, and the female section has the die cavity of the required cross sectional shape to define the outer shape of the tube.

U.S. Pat. No. 5,353,639 to Brookins, et al, which is incorporated herein by reference, provides additional detail regarding a method and apparatus for sizing a plurality of micro extruded tubes used in such low profile extrusions. As described by the Brookins patent, a predetermined number of micro extruded tubes are stacked on the base fence between the fixed side fence and the clamping fence. The internal webs of the tubes are aligned throughout the stack, perpendicular to the plane of the base fence. The clamping fence is moved toward the stack of tubes to prevent the stack from moving laterally. The die platen is moved toward the stack of tubes and the mating surface of the die platen is in mating engagement with a side surface of the uppermost tube in the stack. A predetermined amount of pressure is applied to the stack of tubes through the die platen. The pressure is applied equally across the entire side surface of the uppermost tube and is transmitted equally through all the tubes of the stack in the sizing die.

Other developments in cooling apparatus may be seen in U.S. Pat. No. 5,285,347 to Fox et al., which describes a hybrid cooling system for electrical components. A hybrid heat sink is specially adapted to transfer heat to two cooling fluids. This heat sink is incorporated into a cooling system in which some of the electronic components of an electronic device may be cooled by two cooling fluids and some electronic components may be cooled by one cooling fluid. The electronic components are mounted on a circuit board. In the Fox reference, one of the cooling fluids is air and one is a liquid. The hybrid heat sink is attached to electronic components that cannot be cooled to the normal operating range by the cooling air alone. The cooling air is caused to flow over the surface of the heat sink, removing some of the heat. In addition, the cooling liquid is caused to flow through the heat sink, thereby removing additional heat. In addition, U.S. Pat. No. 5,901,037 to Hamilton, et al. describes a system for closed loop liquid cooling for semiconductor RF amplifier modules. The system comprises a combination of a plurality of elongated microchannels connected between a pair of coolant manifolds for conducting liquid coolant beneath the transistors to dissipate the heat generated thereby. The system also includes a heat exchanger, a miniature circulating pump located on the module, and passive check valves having tapered passages for controlling the flow of coolant in the loop. The valve comprises a truncated pyramid-shaped microchannel valve having no moving parts and is fabricated so as to be a part of either the circulating pump assembly, the coolant manifold, or the microchannels.

It has been shown that the use of multiple layers of LPE's greatly improves the efficiency of the heat removal process. Furthermore, it is disclosed in the above-referenced co-pending U.S. application Ser. No. 10/328,537, U.S. application Ser. No. 09/328,183, U.S. application Ser. No. 10/328,438 and U.S. patent application Ser. No. 09/328,183, that heat pipes provide superior performance in a low-profile, light-weight package. Moreover, the stacking of a series of heat pipes provide superior performance in a low profile, light weight package. It would be an advantages therefore to provide a design incorporating a stacked array of liquid-loop LPE cooling systems, facilitating the circulation of the heat transfer fluid through a stacked liquid-loop system.

SUMMARY OF THE INVENTION

The present invention relates to liquid-loop cooling systems and methods of manufacture. More particularly, one embodiment of the present invention relates to a stackable endcap and method for circulating a heat transfer fluid throughout an array of LPE's. In one aspect, the invention includes a stackable endcap having a channel formed therethrough for the flow of heat transfer fluid into and out of a liquid loop cooling system. In one embodiment, the system of the present invention includes a first LPE, and stacked on top of the first LPE is a second LPE in fluid connection with the first LPE through a channel formed in the endcaps. A third LPE is likewise in fluid connection with first and second LPE's through a set of endcaps.

In another embodiment, the first, second and third LPE's have a fin stock secured to their outer surfaces to improve the heat transfer efficiency of the system.

The present invention provides many advantages for a user of the liquid loop cooling system. First, through the stackable endcap design, the system may be tailored to the specific heat removal requirements of a heat generating component. Second, the liquid loop system of the present invention is designed to operate with any number of heat transfer fluids, such as water, glycol and fluorinated polyethers that are common in the semiconductor industry.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 5A is a schematic illustration of another embodiment of the above-referenced low-profile extrusion heat exchange apparatus of an unstacked variety, shown as a liquid to liquid manifold cooling apparatus;

FIG. 5B is a schematic illustration of another embodiment of the above-referenced low-profile extrusion heat exchange apparatus of an unstacked variety, shown as a liquid to air manifold cooling apparatus;

DETAILED DESCRIPTION

It has been found that the use of liquid loop cooling systems can be very advantageous, and that the implementation of stackable endcaps for circulating a heat transfer fluid through a stacked array of LPE's can improve multiple manufacturing and performance aspects thereof. The invention is thus illustrated herein in FIGS. 15-18, and various modifications may be made by a person or ordinary skill in the art.

The present invention may be better understood with reference to FIGS. 1-14, which illustrate low profile extrusion apparatus of the unstacked and stacked variety, the description being set forth for reference purposes. The embodiments are set forth and shown in the above-referenced patent application Ser. No. 10/305,662.

Figure 1:
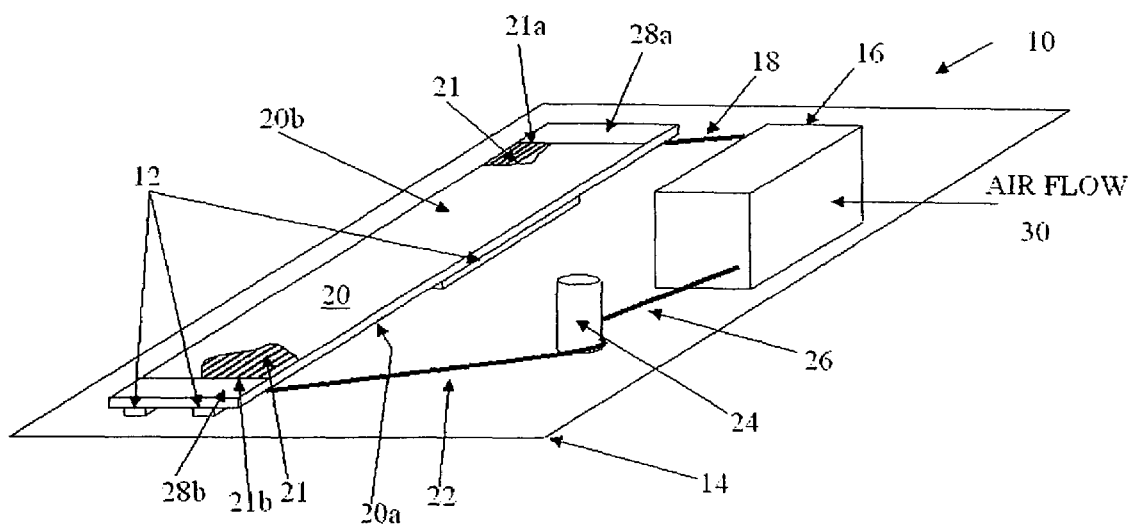
FIG. 1 is a schematic illustration of the low-profile extrusion heat exchange apparatus described in the above-referenced patent application Ser. No. 10/305,662, which is referred to in FIGS. 2-14 below.

Referring first to FIG. 1, there is shown a schematic illustration of a cooling apparatus 10 used for removing heat from certain heat generating components 12 mounted on a printed circuit board 14. The printed circuit board 14 may be housed in a host electronic device (not shown) such as computer, a laptop or notebook computer, or other electronic equipment. Due to the ongoing miniaturization of such host electronic devices, the heat generating components 12 are often located in an area of the printed circuit board 14 and of the host electronic device where space is extremely limited, especially in the "z", or height dimension.

The cooling apparatus 10 is specifically set forth and shown in co pending U.S. application Ser. No. 9/328,183 and generally includes an air-to-air heat exchanger 16, an inlet tube 18, a low profile extrusion 20, an outlet tube 22, a conventional pump 24, and tubing 26. The low profile extrusion 20 has a plurality of micro tubes 21, each micro tube 21 having a micro tube inlet 21a and a micro tube outlet 21b.

Micro tubes 21 are formed by a plurality of longitudinal members. The longitudinal members may be vertical or may be offset from vertical. A preferred offset from vertical is between about 5 E and 60 E. More preferably, longitudinal members are offset from vertical by 30 E. Furthermore, longitudinal members may be provided with a capillary groove. The capillary groove may be positioned on an external surface or on the longitudinal members. Further, the capillary grooves may be provided in groups of one, two, three or more.

Figure 7:
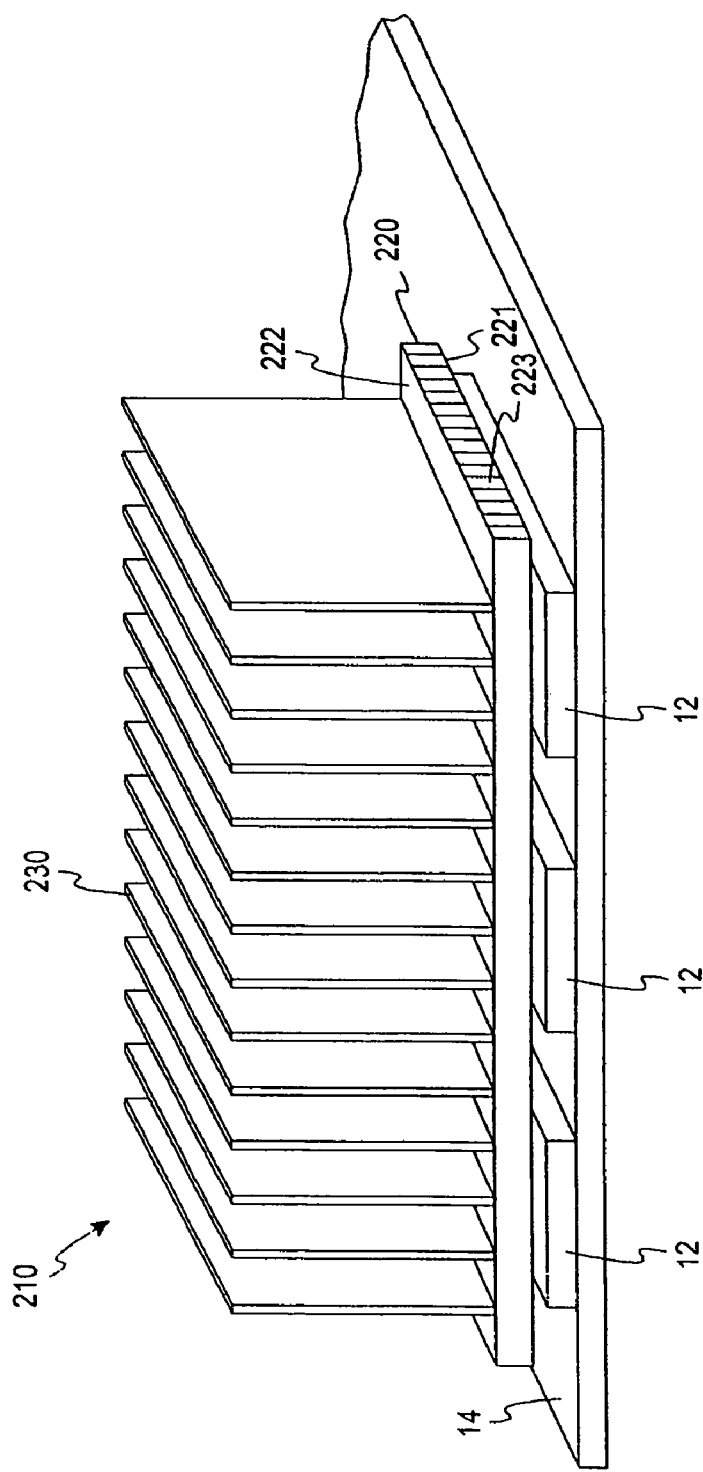
FIG. 7 is a schematic illustration of another embodiment of the above-referenced low-profile extrusion heat exchange apparatus of an unstacked variety, shown as heat pipe base/fin cooling apparatus.
Figure 8:
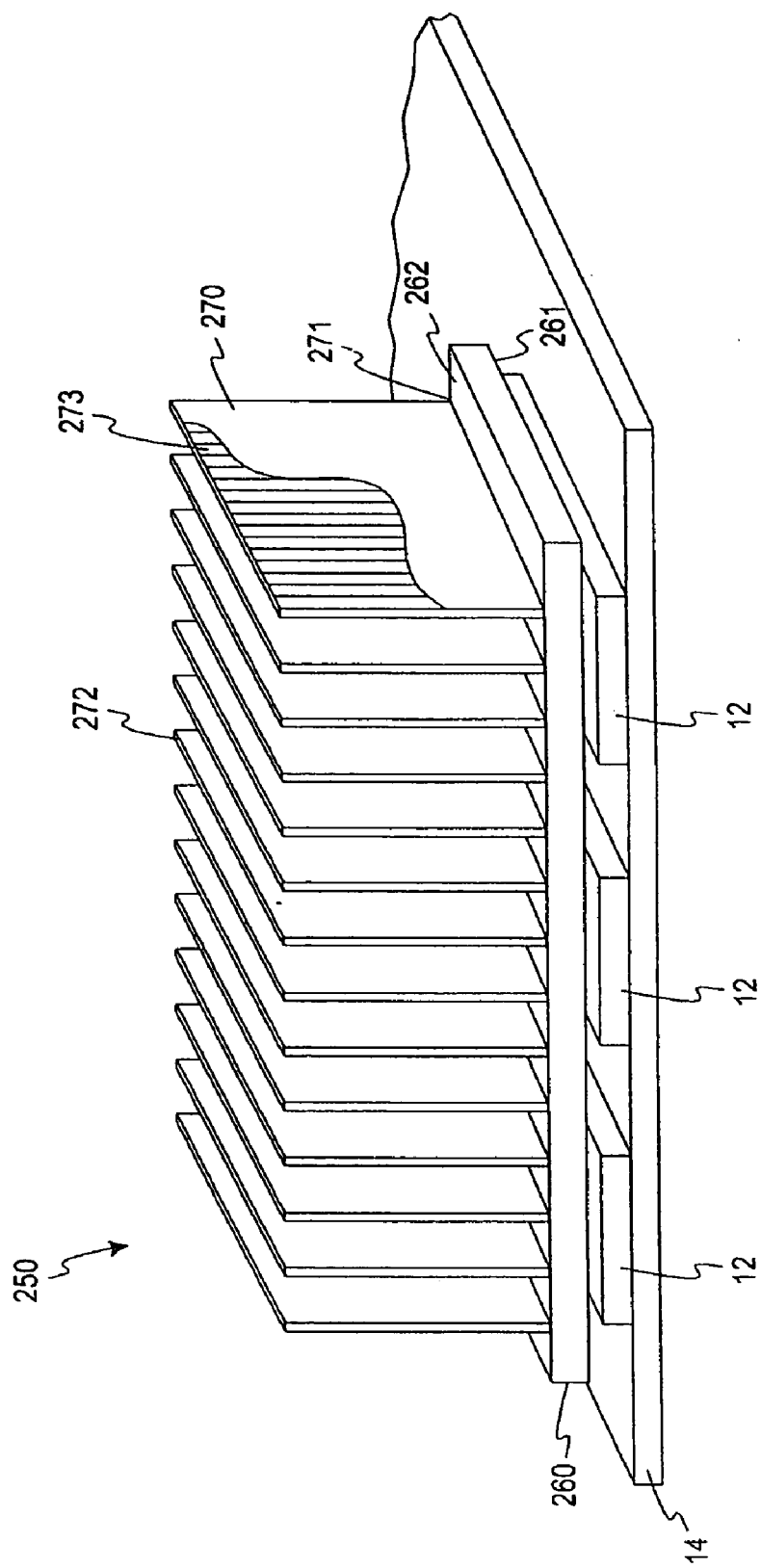
FIG. 8 is a schematic illustration of another embodiment of the above-referenced low-profile extrusion heat exchange apparatus of an unstacked variety, shown as a base/heat pipe fin cooling apparatus.

Referring still to FIG. 1, the extrusion 20 is preferably formed with a flat surface on its underside 20a for contacting heat generating components 12, and may be formed with external fins on its top side 20b to maximize heat transfer, if space allows. It is notable that the micro tubes 21 formed in the extrusion 20 may be of nearly any geometry and that shapes with flattened heat transfer surfaces are generally preferred, but tubes of any shape could be used with varying degrees of efficiency. This is best illustrated in FIGS. 7 and 8, where flat extrusions 20 with rectangular micro tubes 21 are shown. Extrusion 20 is also preferably formed with at least one solid channel (not shown) for mounting to printed circuit board 14. Conventional thermal interface material (not shown) is preferably provided between low profile extrusion 20 and heat generating components 12.

The micro tube inlets 21a of the micro tubes 21 in the extrusion 20 are interconnected in fluid communication, and to the inlet tube 18, by an inlet endcap 28a. Similarly, the micro tube outlets 21b of the micro tubes 21 in the extrusion 20 are interconnected in fluid communication, and to the outlet tube 22, by an outlet endcap 28b. Alternatively, micro tube outlets 21a and/or 21 may be sealed by crimping the low profile member 20. Micro tubes outlets 21a and/or 21b may be individually sealed or connected in fluid communication. The heat exchanger 16 may contain a fluid reservoir (not shown) therein for housing a fluid such as water, glycol, alcohol, or other conventional refrigerants. In addition, a wick, such as screen may be provided within one or all of micro tubes 21. In this case, fluid from the heat exchanger 16 is circulated through the inlet tube 18, the low profile extrusion 20, the outlet tube 22, and the tubing 26 via the pump 24. Alternatively, the entire cooling apparatus 10 may be evacuated and charged with fluid which is then circulated via the pump 24.

During operation of the host electronic device, heat generated by heat generating components 12 is transferred from heat generating components 12 to an evaporator section of low profile extrusion 20, to the fluid circulating within low profile extrusion 20, and then to heat exchanger 16 from a condenser section of low profile extrusion 20. Heat exchanger 16 removes the heat from the fluid in a conventional manner. Preferably, an airflow 30 is passed over heat exchanger 16 to aid in such heat removal. Cooling apparatus 10 thus efficiently removes heat from a limited space, low profile area within the host electronic device (the location of low profile extrusion 20) to an area where it can be removed at a more convenient location and envelope (the location of heat exchanger 16).

Figure 2:
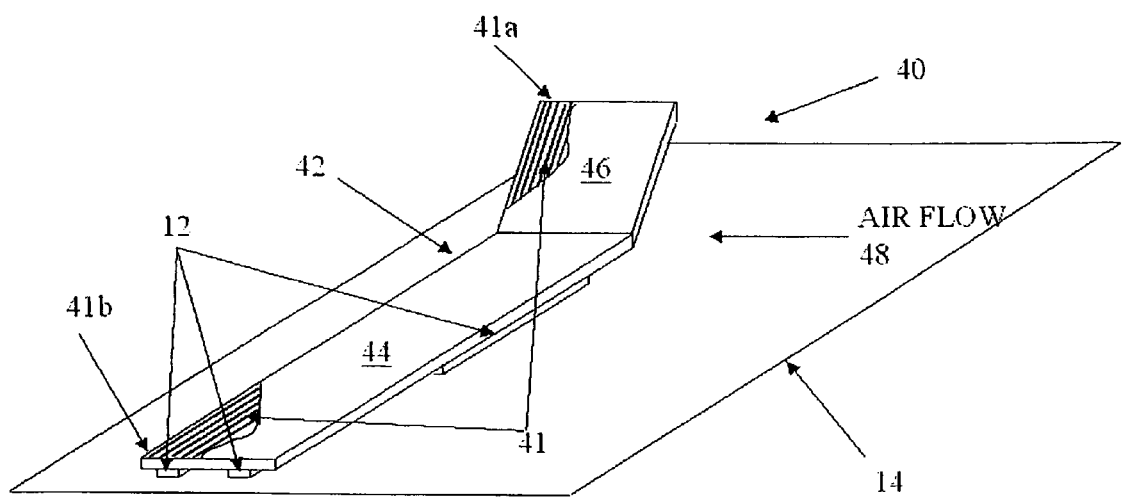
FIGS. 2 and 3 are schematic illustrations of another embodiment of the low-profile extrusion heat exchange apparatus immediately above-referenced.
Figure 3:
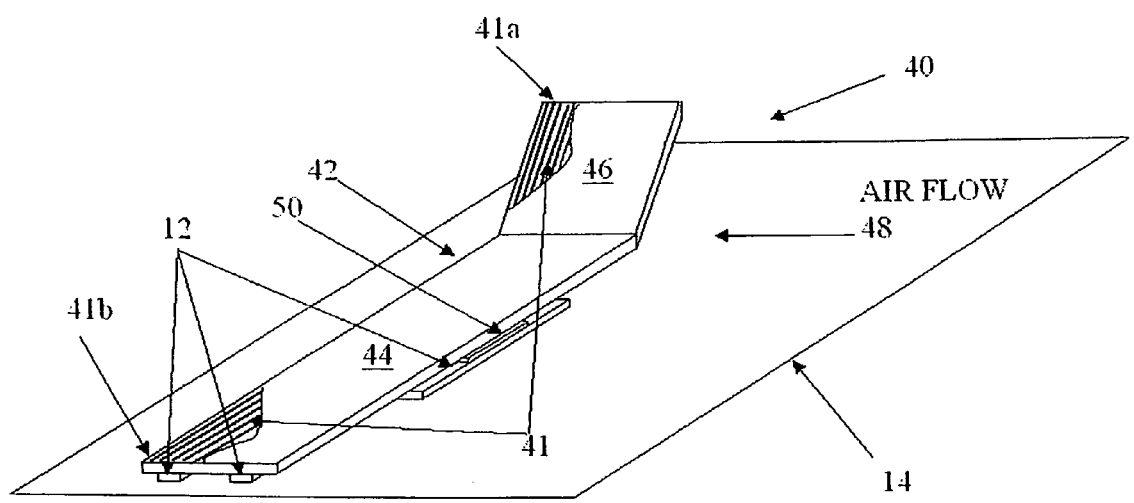

FIGS. 2 and 3 are schematic illustrations of a cooling apparatus 40 used for removing heat from heat generating components 12 on printed circuit board 14. Referring now to FIG. 2, cooling apparatus 40 generally comprises a low profile extrusion 42 manufactured as a heat pipe capable of phase change heat transfer. A preferred method of making a low profile heat pipe extrusion 42 is described in greater detail hereinbelow. The low profile heat pipe extrusion 42 is preferably formed with micro tubes 41, each micro tube 41 having a conventional wick structure such as internal fins, grooved inner sidewalls, or metal screens, so as to maximize their heat transfer capability via capillary action.

To form a heat pipe, the micro tubes 41 of the low profile heat pipe extrusion 42 are evacuated and then charged with a fluid such as water, glycol, alcohol, or other conventional refrigerants before sealing the ends 41a and 41b of the micro tubes 41. The ends may be sealed by crimping. By providing vertically offset longitudinal members, longitudinal members tend to lay over during crimping rather than buckling. Therefore, vertically offset members may be advantageous. As is known in the art, a heat pipe generally has an effective thermal conductivity of several multiples higher than that of a solid rod. This increase in efficiency is due to the fact that the phase change heat transfer coefficients are high compared to the thermal conductivity of conventional materials.

The low profile heat pipe extrusion 42 is preferably formed into an evaporator section or first portion 44 for contacting heat generating components 12 and a raised or condenser section second portion 46. First portion 44 and second portion 46 are preferably substantially similar in construction to low profile extrusion 20 of FIG. 1, except endcaps 28 are not required. First portion 44 acts as the evaporator section of the heat pipe, and second portion 46 acts as the condenser section of the heat pipe.

During operation of the host electronic device, heat generated by heat generating components 12 is transferred from heat generating components 12 to first portion 44. This heat causes the liquid within the micro tubes 41 in first portion 44 to change to vapor, consuming some of the generated heat. Because the vapor is less dense than the surrounding liquid, the vapor and associated heat rise into the micro tubes 41 in second portion 46. Of course, heated liquid may also be transferred from first portion 44 to second portion 46 via the capillary action of the wick structures of the micro extruded tubes therein. In second portion 46, the vapor condenses into liquid onto the inner side walls of the micro extruded tubes 41. The heat generated by the condensation reaction, as well as any heat transferred via capillary action of the wick structure, is then transferred to air flow 48. Cooling apparatus 40 thus efficiently removes heat from a limited space, low profile area within the host electronic device (the location of first portion 44) to an area where it can be removed at a more convenient location and envelope (the location of second portion 46). Of course, if low profile heat pipe extrusion 42 is formed with internal wick structures, it is not necessary that second portion 44 be raised from, or higher than, first portion 42.

Referring now to FIG. 3, low profile heat pipe extrusion 42 is shown in operation with a conventional thermoelectric cooler (TEC) 50 in contact with one of heat generating components 12. A preferred TEC is sold by Marlow Industries, Inc. of Dallas, Tex. TEC 50 facilitates the heat transfer between the heat generating component 12 and first portion 44 of low profile heat pipe extrusion 42, and thus is preferred for use with heat generating components 12 that have high power densities.

Figure 4:
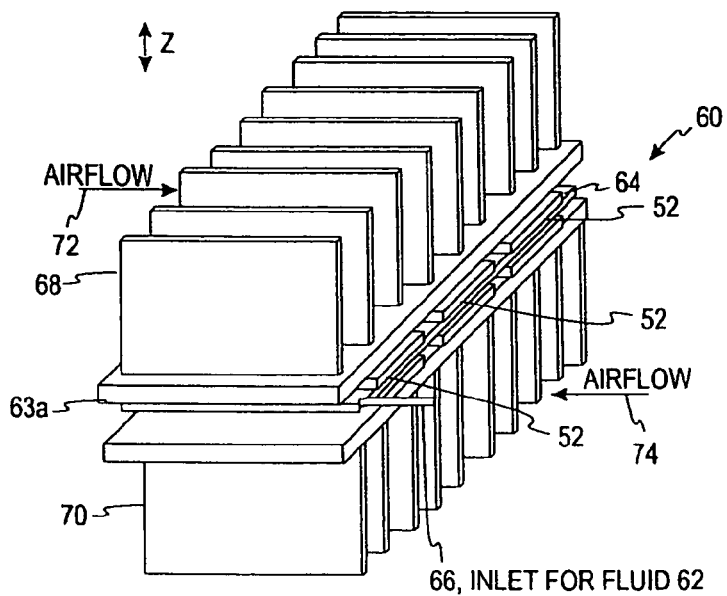
FIG. 4 is a schematic illustration of another embodiment of the above-referenced low-profile extrusion heat exchange apparatus of an unstacked variety, shown as heat transfer component of a recirculatory system.

FIG. 4 is a schematic illustration of a cooling apparatus 60 used for removing heat from a fluid 62, such as water, glycol, alcohol, or other conventional refrigerants. Fluid 62 is then used to cool conventional heat generating components, such as heat generating components 12 of printed circuit board 14. By way of example, cooling apparatus 60 may be used in place of conventional heat exchanger 16 in FIG. 1.

Cooling apparatus 60 generally comprises a low profile extrusion 64, an inlet endcap 63a, an inlet tube 66, an outlet endcap (not shown), an outlet tube (not shown), thermoelectric coolers 52, and conventional bonded fin heat sinks 68 and 70. The low profile extrusion 64 is preferably substantially similar in construction to low profile extrusion 20 of FIG. 1, with a plurality of micro tubes (not shown) having a micro tube inlet and a micro tube outlet (not shown). The micro tube inlets of the micro tubes in the extrusion 64 are interconnected in fluid communication, and to the inlet tube 66, by the inlet endcap 63a. Similarly, the micro tube outlets of the micro tubes in the extrusion 64 are interconnected in fluid communication, and to the outlet tube, by an outlet endcap.

The low profile extrusion 64 preferably has generally flat bottom and top surfaces for contact with thermoelectric coolers (TEC) 52. The conventional bonded fin heat sink 68 is coupled to TECs 52 on the top surface of low profile extrusion 64, and the conventional bonded fin heat sink 70 is coupled to TECs 52 on the bottom surface of low profile extrusion 64.

In operation, the low profile extrusion 64 serves as a manifold, and the TECs 52 remove heat from fluid 62 flowing through the micro tubes of the low profile extrusion 64. This removed heat is transferred from TECs 52 to bonded fin heat sinks 68 and 70, which dissipate the heat to atmosphere in a conventional manner. Preferably, airflows 72 and 74 pass over and through heat sinks 68 and 70 to facilitate such heat dissipation.

Low profile extrusion 64 has a smaller size and mass than conventional heat exchanger manifolds. For example, a conventional manifold has a minimum profile, or height, in the "z" direction of about 0.75 inches, and low profile extrusion 64 may have a profile as low as about 0.1 inches. The reduced mass of low profile extrusion 64 is believed to produce a cooling apparatus 60 with a near zero time constant, increasing startup performance and temperature control. Therefore, cooling apparatus 60 is especially advantageous in applications involving lasers. The wavelength of a laser beam, and thus beam properties, is strongly influenced by temperature, and the tighter temperature control believed to be provided by cooling apparatus 60 is extremely beneficial.

Figure 5C:
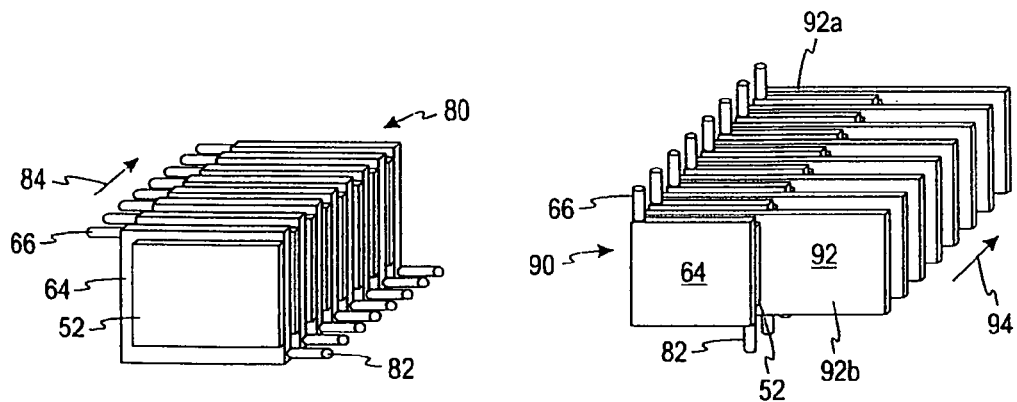
FIG. 5C is a schematic illustration of another embodiment of the above-referenced low-profile extrusion heat exchange apparatus of an unstacked variety, shown as an air to air manifold cooling apparatus.

FIGS. 5A, 5B, and 5C are schematic illustrations of the cooling apparatus=referenced in FIGS. 2-4 incorporating a stacked heat pipe/TEC configuration. FIG. 5A shows a cooling apparatus 80 having a plurality of LPE's 64 and TECs 52 arranged in a serial fashion. A TEC 52 is disposed between, and is in contact with, each of the extrusions 64. Only one low profile extrusion 64 and one TEC 52 is numbered in FIG. 5A for clarity of illustration. Fluid 62 enters each extrusion 64 via inlet 66 and exits each extrusion 64 via an outlet 82. In operation, TECs 52 remove heat from fluid 62 flowing through LPE's 64. This removed heat is transferred to airflow 84 passing over cooling apparatus 80.

FIG. 5B shows a cooling apparatus 90 having a plurality of LPE's 64, TECs 52, and low profile heat pipe extrusions 92 arranged in a serial fashion. More specifically, a TEC 52 is disposed between, and is in contact with, each low profile extrusion 64 and low profile heat pipe extrusion 92. Only one low profile extrusion 64, one TEC 52, and one low profile heat pipe extrusion 92 are numbered in FIG. 5B for clarity of illustration. Each low profile heat pipe extrusion 92 is preferably substantially similar in construction to low profile heat pipe extrusion 42 of FIG. 1, excluding raised portion 46. Fluid 62 enters each extrusion 64 via inlet 66 and exits each extrusion 64 via outlet 82. In operation, each TEC 52 removes heat from fluid 62 flowing through an adjacent low profile extrusion 64. This removed heat is transferred to the evaporator portion 92a of the adjacent low profile heat pipe extrusion 92. The heat is then transferred to the condenser portion 92b of the low profile heat pipe extrusion 92, as is explained hereinabove in connection with low profile heat pipe extrusion 42 of FIGS. 2 and 3. An airflow 84 passing over cooling apparatus 90 dissipates heat from each condenser portion 92b of each low profile heat pipe extrusion 92.

FIG. 5C shows a cooling apparatus 100 having a plurality of TECs 52 and low profile heat pipe extrusions 92 arranged in a serial fashion. More specifically, a TEC 52 is disposed between, and is in contact with, each low profile heat pipe extrusion 92, and the "free end" of adjacent low profile heat pipe extrusions 92 extend in opposite directions. Only one TEC 52 and two low profile heat pipe extrusions, 92N and 92O, are numbered in FIG. 5C for clarity of illustration. In operation, a hot airflow 102 flows over each evaporator portion 92a of low profile heat pipe extrusions 92N. This heat is transferred from evaporator portion 92a to condenser portion 92b of extrusion 92N, as is explained hereinabove in connection with low profile heat pipe extrusion 42 of FIG. 2 and 3. Condenser portion 92b of extrusion 92N is in contact with TEC 52. The TEC 52 removes heat from condenser portion 92b of extrusion 92N and transfers it to evaporator portion 92a of low profile heat pipe extrusion 92O. This heat is then transferred from evaporator portion 92a to condenser portion 92b of extrusion 92O. Cold airflow 104 passing over condenser portions 92b of each extrusion 92O dissipates heat from cooling apparatus 100.

Cooling apparatus 80, 90, and 100 have the same applications and advantages of cooling apparatus 60 described hereinabove. As will be appreciated by one skilled in the art, cooling apparatus 60, 80, and 90 may also be operated as heating apparatus by using thermoelectric coolers (TECs) 52 to heat, rather than to cool, a fluid.

Figure 6:
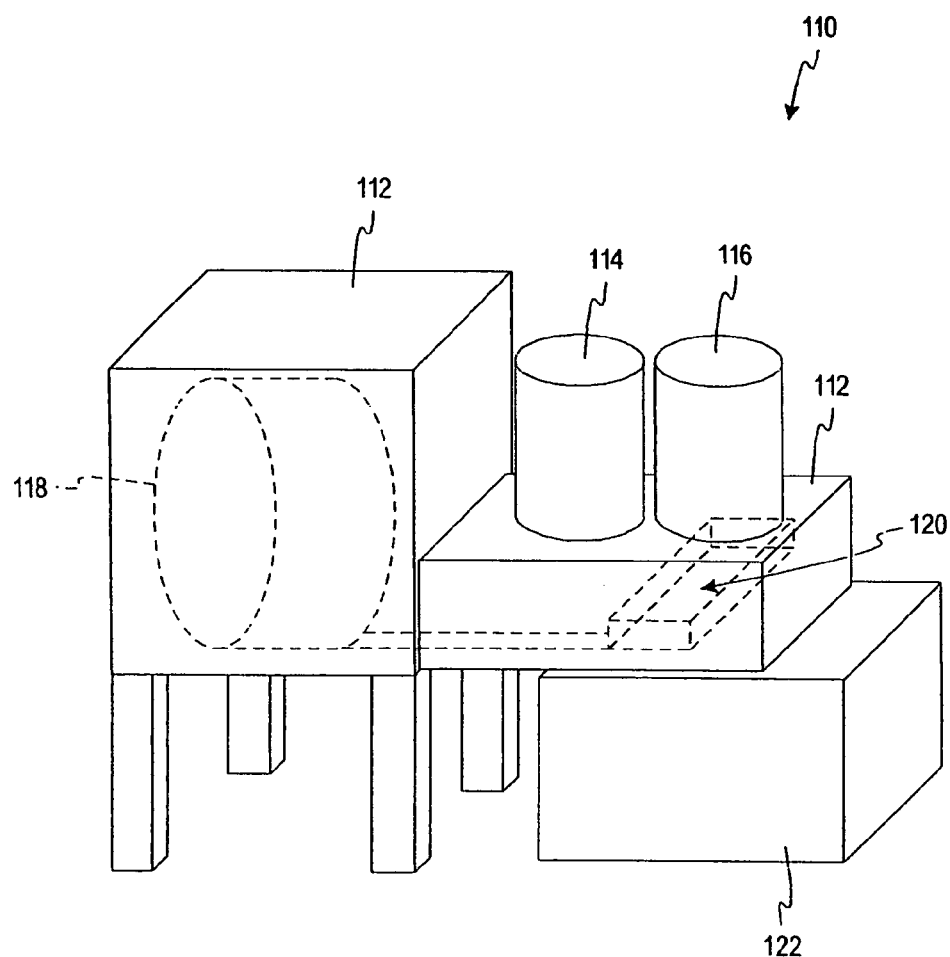
FIG. 6 is a is a schematic illustration of a method and apparatus for manufacturing heat pipes according to an embodiment of the above-referenced heat exchange apparatus of an unstacked variety.

FIG. 6 is a schematic illustration of a method and apparatus for manufacturing LPE's or heat pipes. As noted hereinabove, the preferred apparatus and method may be utilized to make LPE's of FIGS. 1, 2, 3, 4, 5A, 5B, and 5C as well as the extrusions of FIGS. 7-16. However, the preferred apparatus and method may also be utilized to make extruded hollow tubes for other heat exchangers and heat pipes.

Apparatus 110 generally includes an oven 112 having an insulated housing. A vacuum station 114 and a fluid charging station 116 are in fluid communication with oven 112. Alternatively, stations 114 and 116 may be separate from oven 112. A coil 118 is disposed within a portion of oven 112 on a conventional automatic feed system. Coil 118 may be a coil of hollow tubing, a coil of low profile extrusion, or a coil of other conventional extrusion having a series of extruded hollow tubes therein. Furthermore, coil 118 comprises any material that can be formed and welded with any fluid fill. This includes, but is not limited to aluminum, stainless steel, carbon steel, copper, and titanium alloys. An ultrasonic welder/sealer is also provided. One model of ultrasonic welder/sealer is the Ultraseal7 series sold by American Technology, Inc. of Shelton, Conn. A brochure entitled "Ultraseal7-20 20 kHz Portable Ultrasonic Metal Tube Sealer" (hereinafter the "Amtech Brochure") provides additional information regarding the Ultraseal7 series of ultrasonic welder/sealers and is incorporated herein by reference. A preferred ultrasonic welder/sealer is the Stapla Ultrasonic gantry style seam welder.

In a conventional process, the first step is actually forming and cutting the heat exchanger, heat pipe, or extruded tubes into the desired configuration. Next, this preformed system is evacuated and charged with a fluid such as water, glycol, alcohol, or other conventional refrigerants. The system is then sealed, completing the process. Conventional processes are expensive because they are labor intensive and require long setup times for different configurations of heat exchangers, heat pipes, or extruded tubes.

However, apparatus 110 may be used to efficiently and economically produce heat exchangers, heat pipes, and extruded tubes, including LPE's, according to the following preferred process. First, coil 118 is placed within a heat producing device such as oven 112 on the automatic feed system. Second, coil 118 is evacuated using vacuum station 114. Preferably, coil 118 is pulled down to a vacuum of about $10^{-7}$ torr for a period lasting approximately twenty four hours to many weeks depending on performance requirements. Third, coil 118 is charged with a known amount of fluid, such as water, glycol, alcohol, acetone or other conventional refrigerants, using charging station 116. Acetone is the preferred fluid. Alternatively, coil 118 may be evacuated and charged outside oven 112. Fourth, oven 112 heats coil 118 until at least some of the fluid is in the vapor phase, and the vapor fills the interior of coil 118 evenly. Fifth, using the automatic feed system, the heated and charged coil 118 is reeled out. Preferably the fluid exits the oven 112 at approximately 40 EC to 60 EC allowing enough thermal inertia to draw vapor into the extrusion external to the oven. A temperature sender container may be provided to ensure that the fluid exit temperature is maintained at a desired level. The coil is then processed by crimping, sealing, and cutting the coil 118 into desired lengths. The temperature difference between the oven 118 and the ambient air (or air-conditioned air) temperature condenses the charging fluid in each pipe before it is crimped. These temperatures and flows are used to control the individual heat pipe fills via a weight analysis. A computer and scale monitor the weight of each part and adjust the oven temperatures accordingly.

Subsequent steps comprise crimping, sealing and cutting the coil 118. A hydraulic press, pneumatic or mechanical means may be used for crimping. An ultrasonic welder/sealer, or another standard welding method such as laser electron beam, resistive, TIG, or MIG welding may be used during the sealing stage. Ultrasonic welding is the preferred process. A plasma cutter, or other standard welding method mentioned herein may be used in the cutting stage. However, the plasma cutter is the preferred method. Finished product is collected within container 122. In this manner, heat exchangers, heat pipes, and extruded tubes, including LPE's, are formed while charged with fluid, significantly reducing the setup time and vacuum expense over conventional processes.

In addition, by separating the coil side of the process from the crimping, sealing and welding process steps, the temperatures for the process steps can be adjusted so as to be in the fluid range for the working fluid. Thus, if a cryogenic heat pipe (charging fluid is typically a gas at normal room temperature) is to be manufactured, the temperature of the process steps would be adjusted such that the charging fluid is a liquid. In a similar manner, high temperature heat pipes, where the charging fluid is typically a solid at room temperatures, can be manufactured.

Referring now to FIG. 7, there is shown an illustration of another embodiment of a low profile cooling system of an unstacked variety. A cooling apparatus 210 is used for removing heat from heat generating components 12 on a printed circuit board 14. The cooling apparatus 210 comprises a low profile extrusion 220 manufactured as a heat pipe capable of phase change heat transfer. The low profile heat pipe extrusion 220 is formed having a plurality of micro tubes 223, preferably having therein a conventional wick structure such as internal fins, grooved inner side walls, or metal screens, so as to maximize the heat transfer capability via capillary action. The micro tubes 223 of the low profile heat pipe extrusion 220 are evacuated and then charged with a fluid such as water, glycol, alcohol, or other conventional refrigerants, before the ends of the micro tubes are sealed.

Referring still to FIG. 7, the low profile heat pipe extrusion 220 has a first surface 221 for engaging the heat generating components 12 and receiving heat therefrom. On a second surface 222 of the low profile extrusion 220, a conventional bonded fin heat sink 230 or a plurality of cooling fins are mounted to the low profile extrusion 220. Preferably, the micro tubes 223 are disposed in a direction perpendicular to the fins 230 for transferring heat between each of the individual fins 230. The heat transfer between the individual fins 230 promotes an even distribution of heat across each of the fins 230. However, the micro tubes 223 can be oriented for the transfer of heat along the length of the fins 230. Additionally, in one embodiment, the micro tubes 223 of the low profile extrusion 220 are oriented for disbursing heat from the heat generating components 12 to areas of the low profile extrusion 220 which are not in contact with the heat generating components 12.

Still referring to FIG. 7, the use of the low profile extrusion 220 for transferring heat in the cooling apparatus 210 increases the effective surface area that is transferring heat from the heat generating components to the cooling fins 230. The resulting cooling apparatus is therefore smaller in size and lighter in weight for the same effective cooling attributes. In some embodiments, the low profile cooling system of an unstacked variety can decrease the weight of an apparatus for cooling a heat generating component by as much as 50% over traditional fins mounted via a metal plate.

Referring now to FIG. 8, there is shown an illustration of another embodiment of a low profile cooling system of an unstacked variety, showing a cooling apparatus 250 used for removing heat from heat generating components 12 on printed circuit board 14. The cooling apparatus generally comprises a base 260 and a plurality of low profile extrusion fins 270. The base 260 has a first side 261 for transferring heat between the cooling apparatus 250 and heat generating components 12. The base 260 also has a second surface 262 for mounting the low profile extrusion fins 270.

Referring still to FIG. 8, the low profile extrusion fins 270 are LPE's manufactured as a heat pipe capable of phase change heat transfer. The low profile extrusion fins 270 are preferably formed with a plurality of micro tubes 273, each internally having a conventional wick structure such as fins, grooved side walls, or metal screens, so as to maximize the heat transfer capability via capillary action. The micro tubes 273 of the low profile extrusion heat piping 270 are evacuated and then charged with a fluid such as water, glycol, alcohol, or other conventional refrigerants, before the micro tubes 273 are sealed.

Still referring to FIG. 8, a first end 271 of the low profile extrusion fins 270 is mounted to the second surface 262 of the base 260 with a second end 272 extending outwardly therefrom. The plurality of low profile extrusion fins 270 are preferably mounted in rows for convection heat transfer to the surrounding environment. In one embodiment, the base 260 can also be formed from a low profile extrusion similar to the low profile extrusion 220 in FIG. 7.

Referring still to FIG. 8, the use of the heat pipe type low profile extrusion fins 270 in the cooling apparatus 250 increases the effective surface area in which heat is transferred from the heat generating components to the surrounding environment via the base 260. The resulting cooling apparatus is therefore smaller in size and lighter in weight for the same effective cooling attributes.

Figure 9:
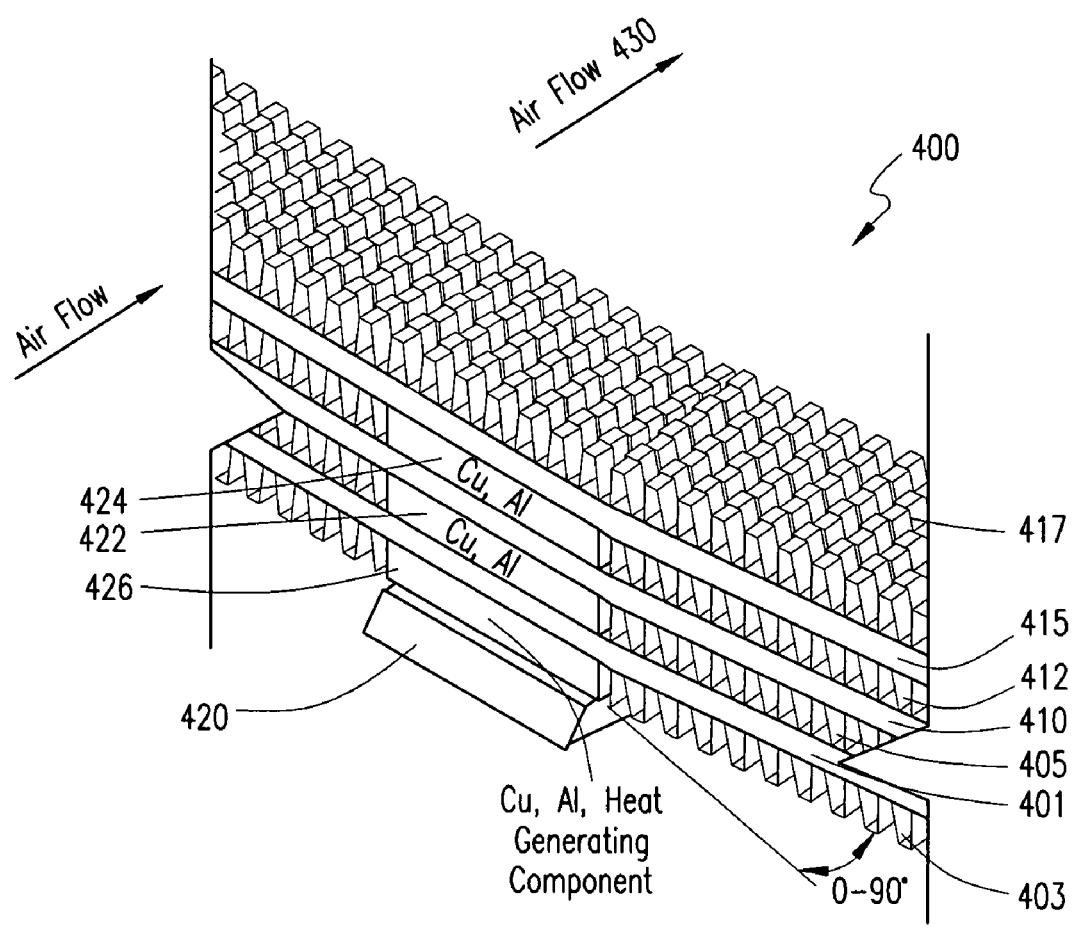
FIG. 9 is an illustration of one aspect of a stacked array of the above-referenced phase plane heat pipes.

Referring now to FIG. 9, there is shown an illustration of a stacked, low profile cooling system 400 with an array of cooling fins secured to an assembly of the low profile extrusion heat pipes described above. More specifically, the stacked, low profile cooling system 400 includes a first phase plane heat pipe 401 with fins 403 secured to an undersurface thereof, and fins 405 secured to a top surface thereof. Stacked on top of the phase plane heat pipe 401 is a second phase plane heat pipe 410, also in thermal contact with the cooling fins 405 disposed on the underside thereof, and further having a set of cooling fins 412 disposed on a top surface thereof. A first thermally conductive spacer block 422 is disposed between the first phase plane heat pipe 401 and the second phase plane heat pipe 410. A third phase plane heat pipe 415 is stacked on top of the first and second phase plane heat pipes 401 and 410 also in thermal contact with the cooling fins 412 and further being assembled with cooling fins 417 stacked on a top surface thereof. Similarly, a second thermally conductive spacer block 424 is disposed between the second phase plane heat pipe 410 and the third phase plane heat pipe 415. It may be seen that the cooling fins 403, 405, 412, and 417 include elongated arrays in thermal contact with said phase plane heat pipes. As shown herein, an angle between 0 and 90 degrees is suggested relative to the angulated portion of the phase plane heat pipe extending laterally outwardly from element 426, which may be a heat source or a third thermally conductive spacer block disposed beneath the first phase plane heat pipe 401 with a heat generating component 420 disposed therebeneath (as shown in FIG. 9). The heat source 420 may be any of a plurality of heat generating components, such as computer chips and/or elements within an electrical circuit. As also referenced in FIG. 9, the type of material, either copper or aluminum, has been specified on the thermally conductive spacer blocks 422, 424, and 426. The thermally conductive spacer blocks 422, 424, and 426 provide a conduit for heat transfer from the heat generating component 420 up to and through the stacked, low profile cooling system.

Figure 10:
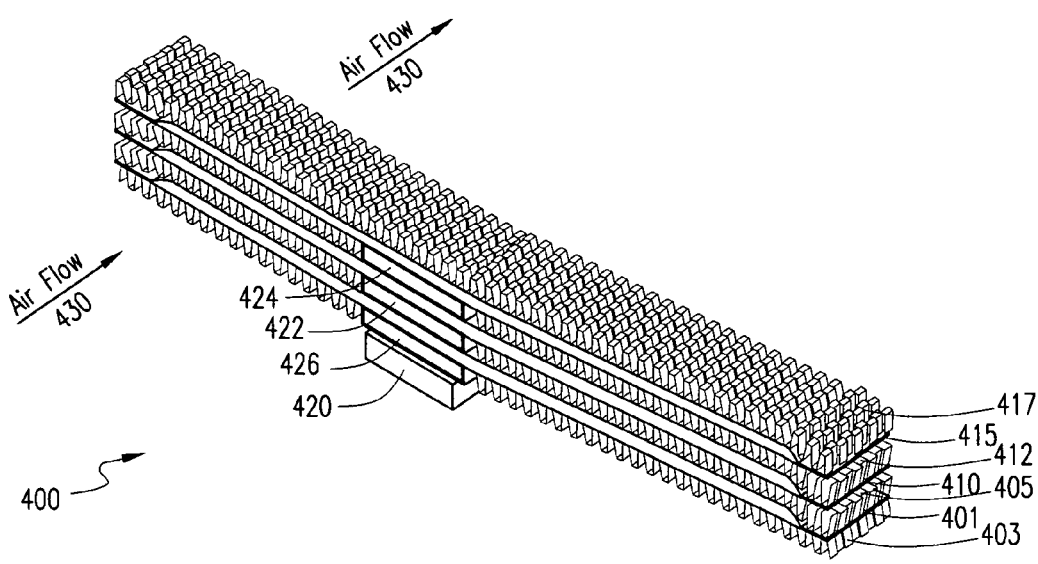
FIG. 10 is a perspective view of an embodiment of a stacked array of phase plane heat pipes.

Referring now to FIG. 10, there is shown a perspective view of the stacked, low profile cooling system 400 of FIG. 9. In this particular embodiment, air flow is in the direction of arrow 430. Air is permitted to flow around and through the fins 417, 412, 405, and 403 to provide the cooling of the surfaces of the phase plane heat pipes 401, 410, and 415. In this way the stacked, low profile cooling system 400 provides improved operational efficiencies.

Figure 11:
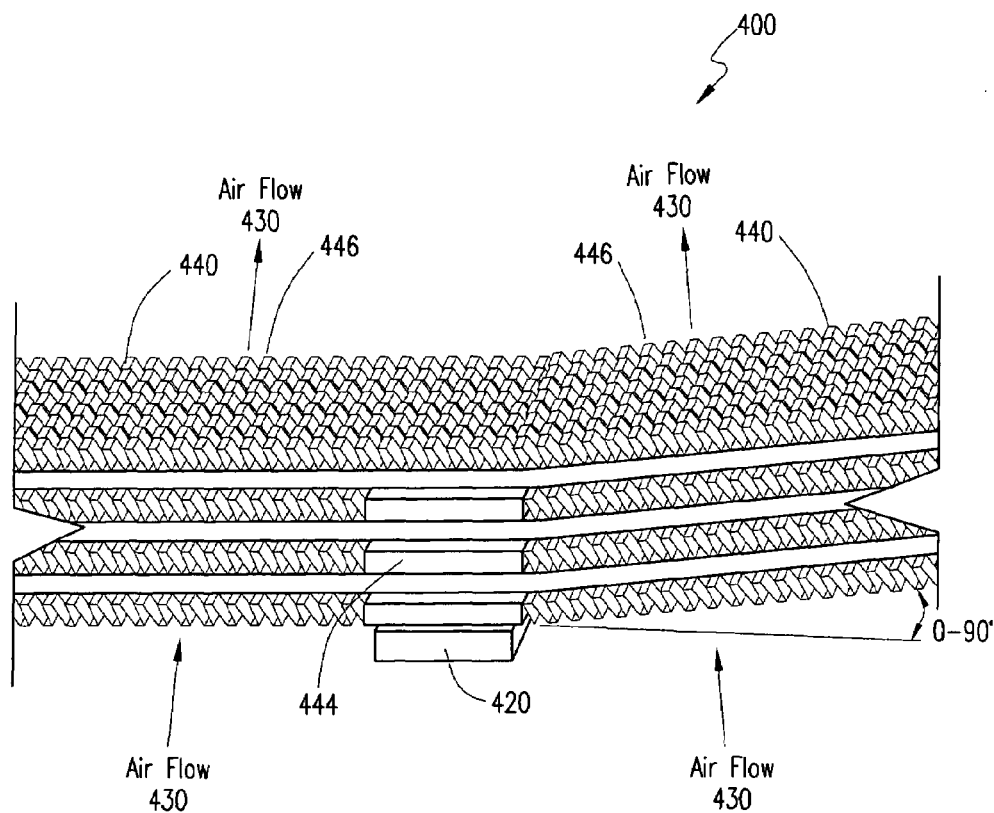
FIG. 11 is a side view of an embodiment of a stacked array of the above-referenced phase plane heat pipes.

Referring now to FIG. 11, there is shown a side view of the stacked, low profile cooling system 400 of FIGS. 9-10. The stacked, low profile cooling system 400, as described above, includes a condenser section 440 where condensing occurs. Likewise, an evaporator section 444 is illustrated in a generally centrally disposed area of the stacked, low profile cooling system 400 wherein heat is absorbed from the heat source 420. The absorption of the heat by the stacked, low profile cooling system 400 causes evaporation and the movement of the fluid within the phase plane heat pipes 401, 410, and 415 through adiabatic sections 446 wherein the fluid is allowed to expand without either loss or gain of heat, as is the technical definition of adiabatic. The angle of 0 to 90 degrees as shown herein further facilitates the movement of the evaporated fluid into the extremities of the heat pipes for the condensation thereof in the condenser sections 440, and the flow of fluid back through the adiabatic sections 446 and into the evaporator section 444 where additional heat may be absorbed.

Referring now to FIGS. 9, 10, and 11, the stacked, low profile cooling system 400 illustrates phase plane heat pipes in an innovative manner providing a low profile and lightweight cooling alternative to conventional heat sinks. The low profile and flat phase plane heat pipes provide an ideal surface to attach to a heat generating component and fins to cool the component. Through the stacking of phase planes, heat removal rates of over 100 watts can be achieved for a standard 31×31 mm microprocessor, or keep lower wattage microprocessors at a lower operating temperature.

Referring still to FIGS. 9, 10 and 11 in combination, there is shown the stacks of the phase plane heat pipes 401, 410, and 415 that provide a low profile, high watt density heat removal design. The materials of construction preferably include copper, aluminum, or other thermally conductive substances. This is particularly true of the thermally conductive spacer blocks 422, 424, and 426 above described and secured to the heat generating component 420 (as shown in FIG. 9). The attachment process can be done through mechanically compressing the heat generating device to the heat sink with a thermal pad or thermal grease therebetween. The specific mounting mechanism is not shown herein and can include a variety of methods currently used in the heat sink market place. The base stack that is in contact with the heat generating component may also be the phase plane heat pipe as well. The fins 403, 405, 412, and 417 can be attached on both sides of the phase plane heat pipes 401, 410, and 415 providing surface area for the air/heat exchange to reduce the temperature of the cooling system 400 of FIGS. 9-11, and thus the heat generating component 420. Air is ducted across the cooling fins 403, 405, 412, and 417 and the heat pipes 401, 410, and 415 in the manner shown in FIGS. 9-11.

Again referring to the operation of the stacked, low profile cooling system 400, the evaporator section 444 comprise that region of the phase plane heat pipes where the heat generating component 420 is positioned, as best illustrated in FIG. 11. The condenser sections 440 of the phase plane heat pipes located toward the ends thereof provide for the recirculation of the fluid therein and through the adiabatic sections 446. Significant increases in performance are provided when gravity aids the operation of the individual phase plane heat pipes. The design can have an angular range from 0 degrees (horizontal) to 90 degrees (vertical), depending on the design parameters required for a particular device. Through the stacking approach and increased effective fin-surface area, the stacked, low profile cooling system will provide superior performance in a low profile package.

Figure 12:
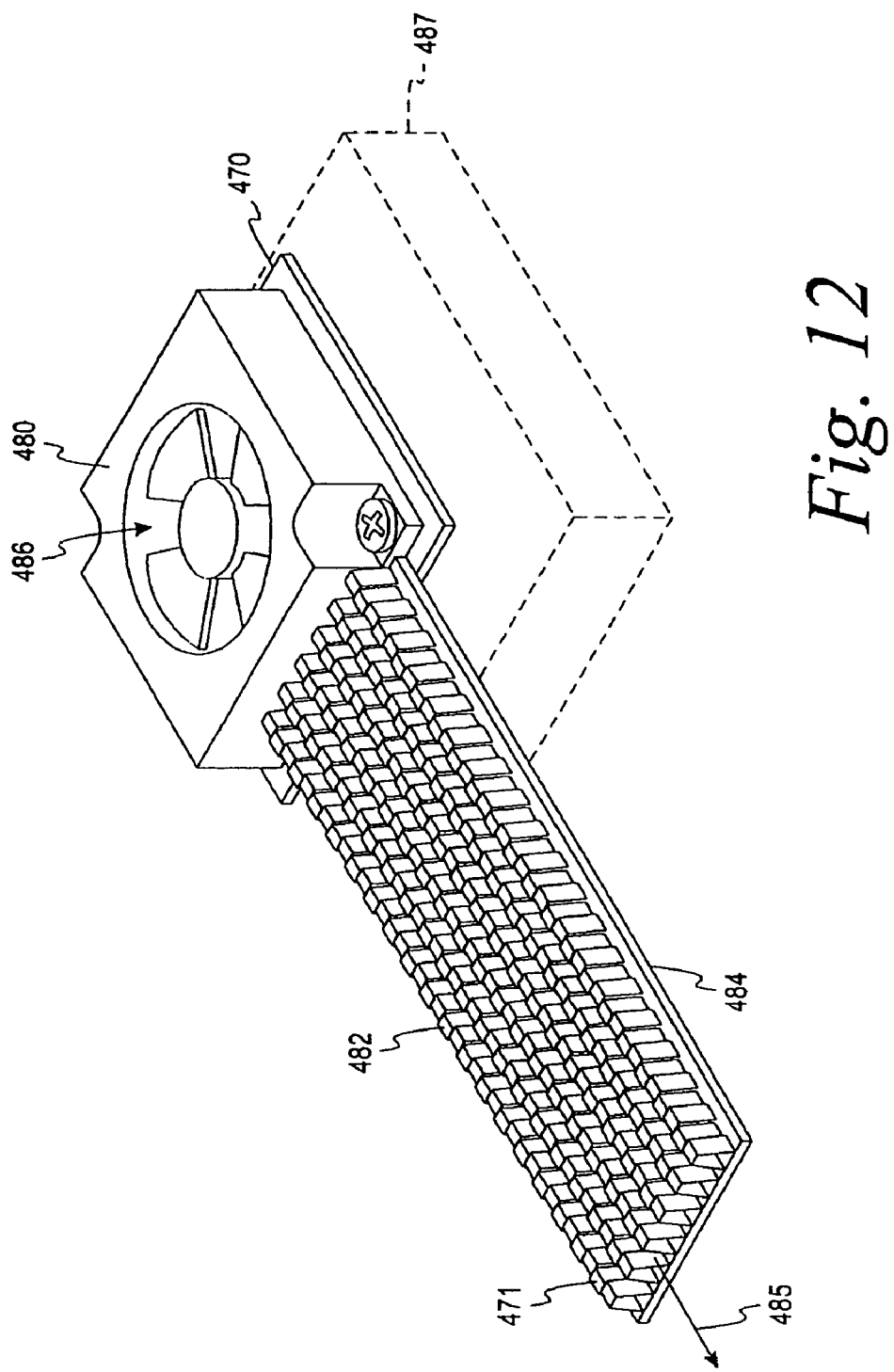
FIG. 12 is an embodiment of the above-referenced phase plane heat pipe incorporating fins and a fan.

Referring now to FIG. 12, there is shown an alternative embodiment of the stacked, low profile cooling system incorporating a possible design for a laptop computer. A heat generating component 487 is shown in phantom and may comprise a printed circuit board disposed in a laptop computer. In this particular embodiment, air is sucked into a fan 480 as shown by arrow 486. As shown by arrow 485, air is blown out the sides through fin stock 482 mounted upon at least one phase plane heat pipe 484 of the type set forth and described in FIGS. 9-11. The evaporator section 470 of the phase plane heat pipe 484 is thermally and mechanically affixed to the heat generating component 487. The fins 482 are placed on the condenser section 471 to aid in the cooling thereof. A 0 degrees to 90 degrees orientation may be placed on the phase plane 484 between the evaporator section 470 and the condenser section 471. In another embodiment, a stacked array of heat pipes may be utilized in accordance with the stacked, low profile cooling system, as well as the utilization of a phase plane heat pipe on both sides of the fan 480.

Figure 13:
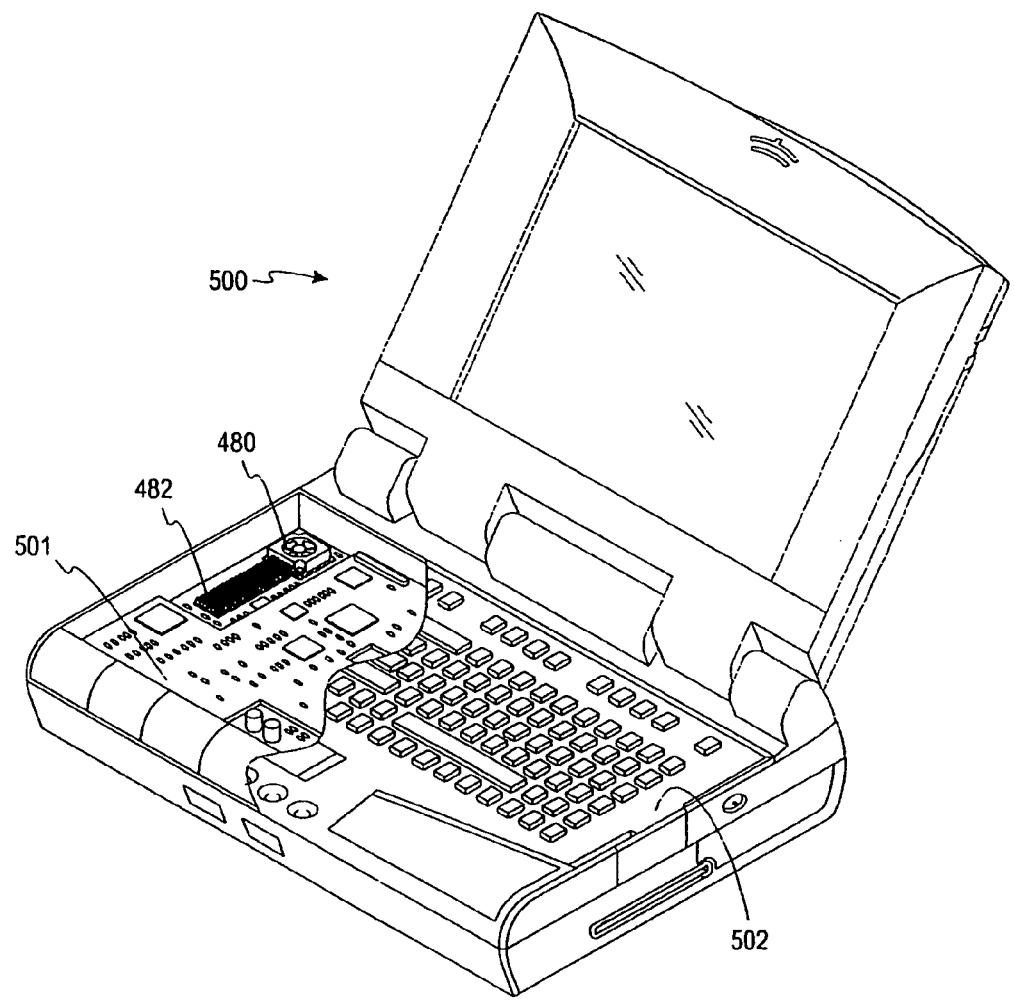
FIG. 13 is an illustration of a laptop computer including above-referenced phase plane heat pipe incorporating fins and a fan.

Referring now to FIG. 13, a laptop computer 500 including an embodiment of the stacked, low profile cooling system of FIG. 12 is described. The fan 480 is disposed in a corner beneath a keyboard 502 and above a heat source 501 such as a circuit board. Air is drawn in to the fan 480 and dispersed outward through the fin stock 482. Although the fin stock 482 is illustrated as being positioned vertically in the laptop, the fin stock 482 may also be positioned in other orientations, such as horizontally.

Figure 14:
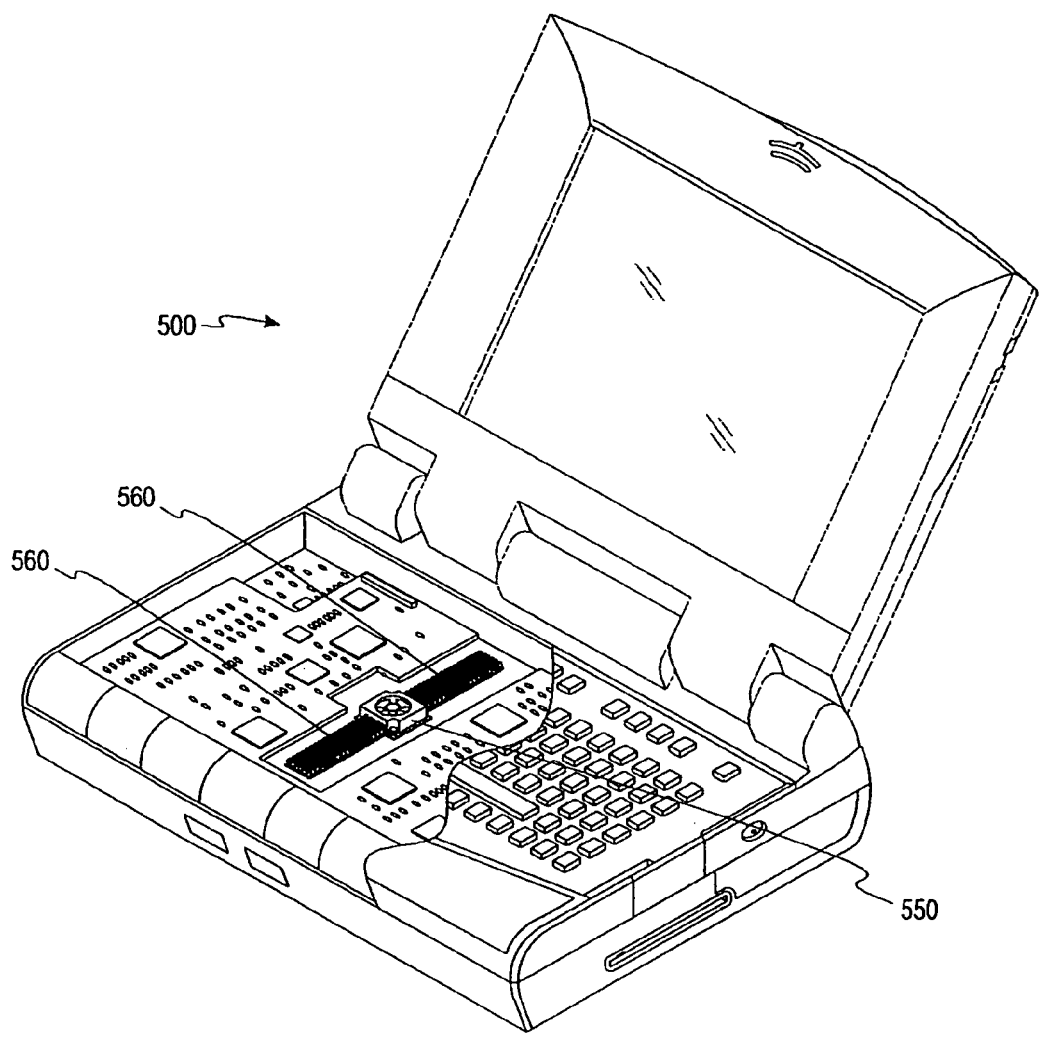
FIG. 14 is an illustration of a laptop computer including an another embodiment of the above-referenced phase plane heat pipe incorporating fins and a fan of FIG. 13.

Referring now to FIG. 14, there is shown an alternate embodiment of the stacked, low profile cooling system of FIG. 12 disposed in a laptop computer 500. In this embodiment, a fan 550 is connected with two fin stocks 560 for dispersing heat. The fan 550 may be located anywhere within the laptop 500 and have one or more fin stocks 560 associated with the fan 550. The fin stocks 560 may be located at opposite sides of the fan 550, or form an L-shape. The fan 550 may also have more than two fin stocks 560 associated therewith.

Various embodiments of the stacked, low profile cooling system may also include cross configurations where the phase plane heat pipes extend orthogonally one to the other and/or at angles acute to each other for purposes of positioning around components within an electrical system, such as a computer, and/or to improve air flow thereacross to improve the thermal efficiency thereof. These aspects are set forth and shown in co-pending U.S. application Ser. No. 10/998,199 filed on Nov. 26, 2004, which is incorporated herein by reference.

Figure 15:
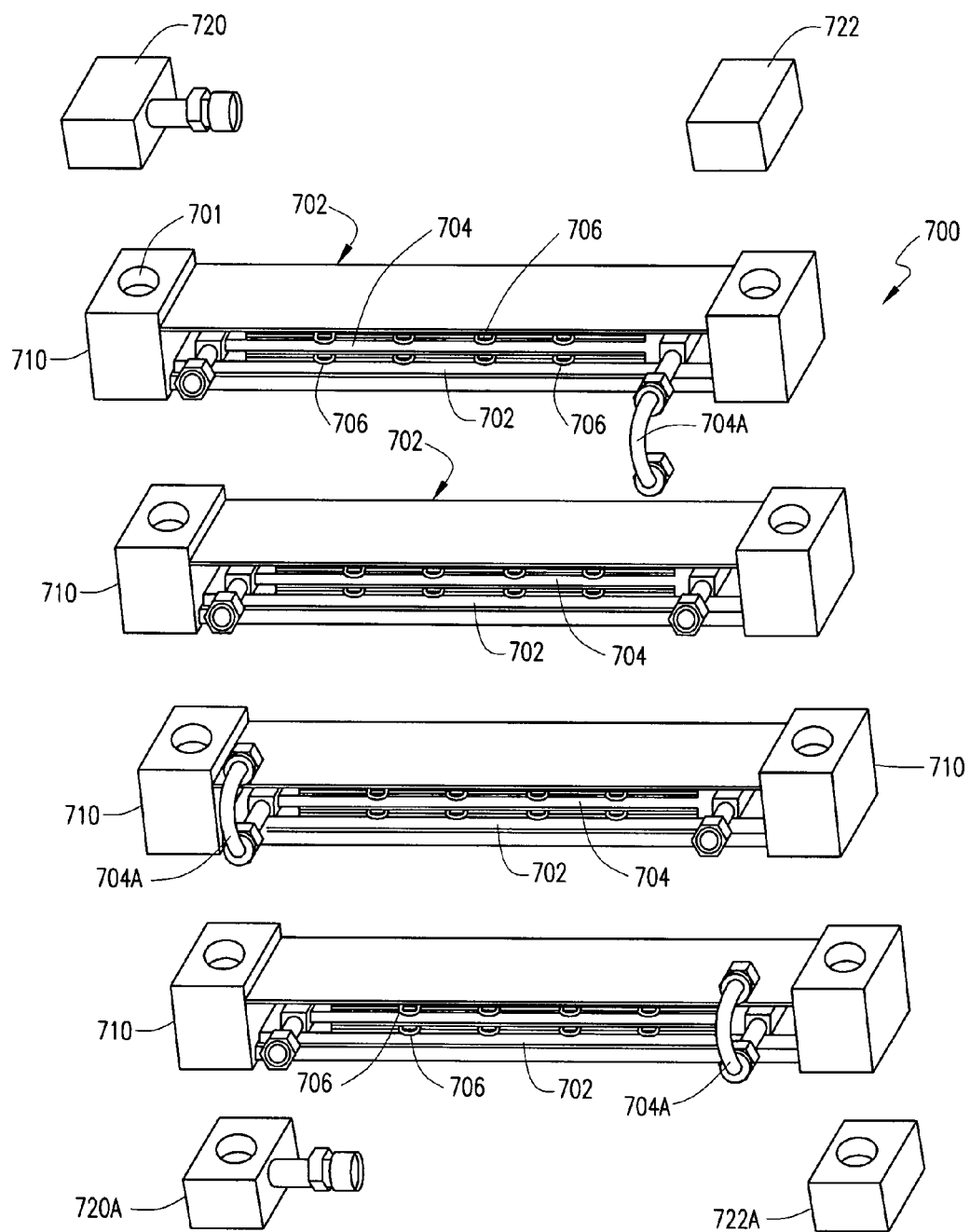
FIGS. 15 and 16 are perspective views of stackable heat pipe/liquid-loop endcap assemblies in accordance with embodiments of the present invention.
Figure 16:
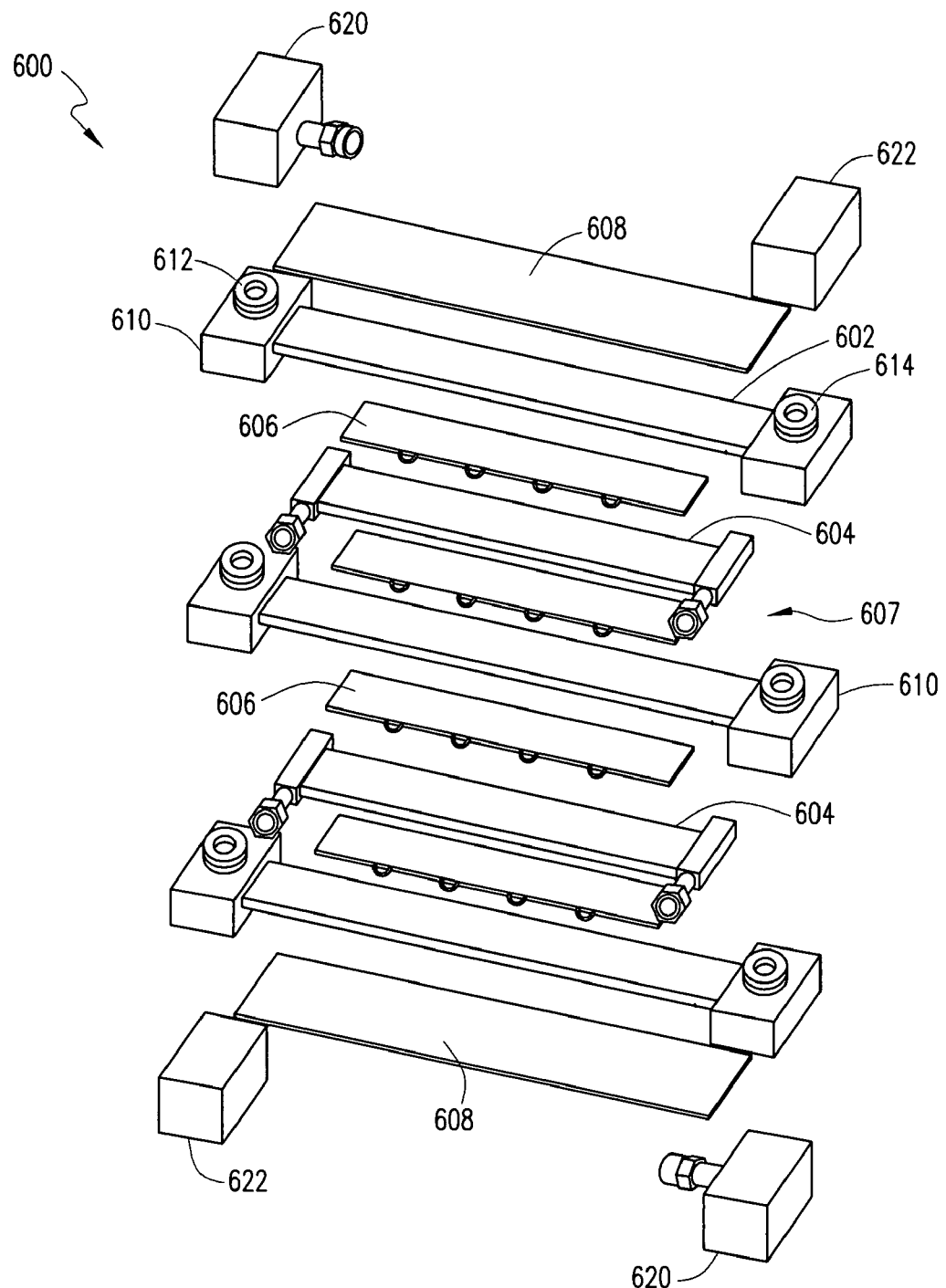

Referring now to FIGS. 15 and 16 in combination, there are illustrated two embodiments of the present invention wherein the endcaps for the low profile extrusion of the liquid loop system 10 of FIG. 1 are each replaced with stackable endcaps. As can be seen in FIG. 15, any number of heat transfer assemblies 700 can be stacked and connected one to another, the low profile extrusions being inserted into slots in the endcaps 710. A heat transfer fluid is pumped through ports and is fluidly connected to a plurality of internal microtubes (not shown) contained within the low profile extrusion through an internal channel. The low profile extrusion may be attached to the endcap by welding, pins or may be inserted into a slot and frictionally held in position by an o-ring or other type of seal. Further, the ports and the slots are designed to accommodate for thermal expansion/contraction of a liquid loop system without loss of heat removal characteristics.

Still referring to FIGS. 15 and 16, in combination, the ports of the endcaps (described in more detail below) allow for any number of endcaps and LPE's to be arranged in a stacked configuration, similar in principle to that shown in FIG. 9-12 with reference to a stacked heat pipe system. As liquid loop systems are arranged in a stacked configuration, O-rings seal the stacked system in fluid connection, and are matingly engaged one with another through the ports. O-rings are chosen of a material to safeguard the system against pressures exerted while the fluid flows through the low profile extrusion.

Referring now to FIG. 15, specifically, there is shown an array of heat transfer assemblies (HTAs) that may be stacked in flow communication one with the other. Each HTA 700 is constructed with an endcap 710 specifically adapted for mating with another HTA 700 or a HTA inlet 720 or HTA capoff 722. In that regard, HTA 700A is shown to be adapted for receiving HTA inlet 720 through mating engagement with the port 701. The port 701 in endcap 710 provides flow communication to a low profile extrusion 702 specifically adapted for absorbing heat from the hot side of a TEC array 706 disposed thereacross. The cool side of the TEC array 706 is exposed to a low profile extrusion 704 which is sandwiched between and exposed to the cold sides of upper and lower TEC arrays 706. Likewise, a second hot side low profile extrusion is disposed outwardly of the second TEC array 706 to absorb heat therefrom. In the discussion below, the low profile extrusions 704 will be referred to as "cold side manifolds" in that said low profile extrusions are specifically adapted for the cooling of heat transfer fluid contained therein. Likewise, the low profile extrusions 702, as shown and described herein, will be hereinafter referred to as "hot side manifolds" in that said extrusions are adapted for containing the flow of heat transfer fluid for the absorption of heat from the TEC array 706 sandwiched therebetween. As will be described below, the HTAs 700 each include a means for flow communication of both the hot side manifolds 702 and the cold side manifolds 704 which flows independent one from the other in accordance with the principles of the present invention.

Still referring to FIG. 15, the HTA 700 is adapted for mating engagement with one or more other HTAs 700 wherein the heat transfer fluid flow of the hot side manifolds 702 is conducted through the endcaps 710 and the porting provided therethrough. The heat transfer fluid flow through the cold side manifold 704 is provided through separate conduits and couplings clearly illustrated and described below.

Referring still to FIG. 15, four separate HTAs 700 are shown in position for coupling one to the other. Any number is possible. Inlet cap 720 is shown disposed atop the HTA 700A while HTA outlet 720A is shown disposed beneath HTA 700B. Likewise, a capoff block 722A is shown in position for matingly engaging the endcap 710 of HTA 700B. Cold side manifold couplings 704A are shown as connectors for the cold side manifolds one to the other in the serial flow pattern shown herein. Likewise, each HTA 700 shows the placement of upper and lower TEC arrays 706 which are sandwiched between hot side manifolds 702. In accordance with the principles of the present invention, any number of HTAs may be assembled one to the other in flow communication therewith for purposes of imparting increased thermal capacity for the cooling of heat transfer fluid flowing through the cold side manifolds 704 described above. The stacked HTA 700 assembly can then be placed in position for heat transfer for a variety of equipment, including that equipment which is racked-mounted or otherwise disposed relative to heat generating components.

Referring now to FIG. 16, there is shown a second embodiment of the present invention wherein an HTA assembly 600 is comprised of a discrete number of hot side and cold side manifolds assembled in a sandwiching configuration with TEC arrays similar to that described above. In the HTA 600, the assembly is secured together by upper and lower stiffener plates 608 to comprise a fixed array.

Still referring to FIG. 16, there is shown an exploded view of the HTA 600 described above. The HTA 600 is comprised of a series of hot side manifolds 602, cold side manifolds 604 and TEC arrays 606. As shown and described in FIG. 15, the TEC arrays are of a generally planar construction adapted for the appropriate thermal engagement with the respective hold and cold side manifolds in a sandwiched configuration affording the select thermal transfer therewith. What is also shown in more detail in FIG. 16 is the endcap assembly. The endcaps 610 as shown herein are shown in mating, flow engagement with the hot side manifolds 602 and comprise an upstanding flow coupling region 612 having an O-ring groove 614 formed therein and adapted for the receipt of an O-ring therearound. The overall number of hot and cold side manifolds is optional, and more or fewer manifolds than that shown herein may be utilized and sandwiched between the upper and lowering stiffening plates 608 which provide structural mounting therefor.

Referring still to FIG. 16, HTA 600 likewise includes inlet and outlet HTA fittings similar to that described in the HTA 700 assembly. The fittings afford the flow of heat transfer fluid for the hot side manifolds. In that regard, an HTA inlet 620 is shown in position for flow communication with an upper endcap 610 having an upstanding flow connector 612 formed therewith. A capoff block 622 is likewise shown for positioning over the opposite endcap 610 for terminating outward flow therefrom and directing all flow downwardly into the underlying endcap 610 in fluid coupling thereto. Plugs 607, diagrammatically shown herein, are used to close-off and direct flow in respective endcaps 610 of FIG. 16 and 710 of FIG. 15.

Still referring to FIG. 16, an individual TEC array 606 is provided for coupling between each hot side manifold 602 and on opposite sides of a cold side manifold 604, sandwiched therebetween. The cold side manifold 604 is likewise shown of a reduced size and with similar conduit coupling members extending outwardly therefrom for coupling one to the other within the stack so that the fluid flow is contained within the second heat transfer fluid system for subsequent use in cooling heat generating components, equipment and the like. The HTA 600 is thus similar in design and heat transfer function to the HTA 700, but in a fixed assembly.

In application, any number of HTA assemblies 600 or 700 may be utilized in accordance with heat transfer capacity requirements of a given application. Obviously, suitable pumps must be provided for pumping the fluid through both the hot and the cold side manifolds. As described herein, the heat transfer fluid flow through the cold side manifolds as shown in FIGS. 15 and 16 may be independent of the heat transfer fluid flow through the hot side manifolds which take heat away from the respective TEC arrays for dissipation. With such a system, the stackable endcaps of the present invention allow a user to "tailor" a liquid-loop cooling system to the specific heat removal requirements of a heat generation component or components. Furthermore, the liquid loop systems of FIGS. 15 and 16 are designed to function with any number of heat transfer fluids, such as water, glycol, and fluorinated polyethers like Galden or Fluorinert common in the semiconductor industry and referenced in the above-referenced co-pending patent applications incorporated herein by reference.

Figure 17:
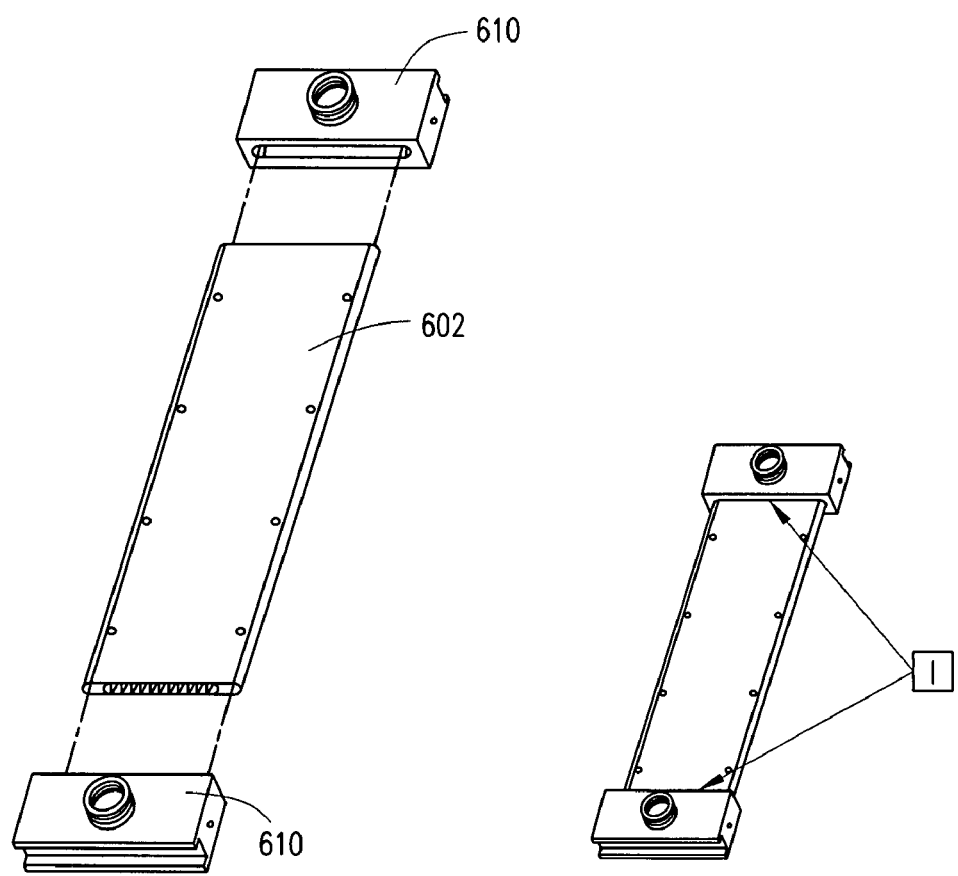
FIG. 17 is a perspective view of the assembly of the endcaps and the hot side manifold of one embodiment of the present invention.

Referring now to FIG. 17, there is a shown a pair of perspective views illustrating the assembly of the endcap 610 to the hot side manifold 602 illustrated in FIG. 16. As described in FIG. 16, the hot side manifold 602 is comprised of a low profile extrusion and the flow of heat transfer fluid therein is facilitated by the endcaps 610 which provide for coupling to other endcaps and the receipt and/or discharge of heat transfer fluid present within the hot side manifold 602.

Figure 18:
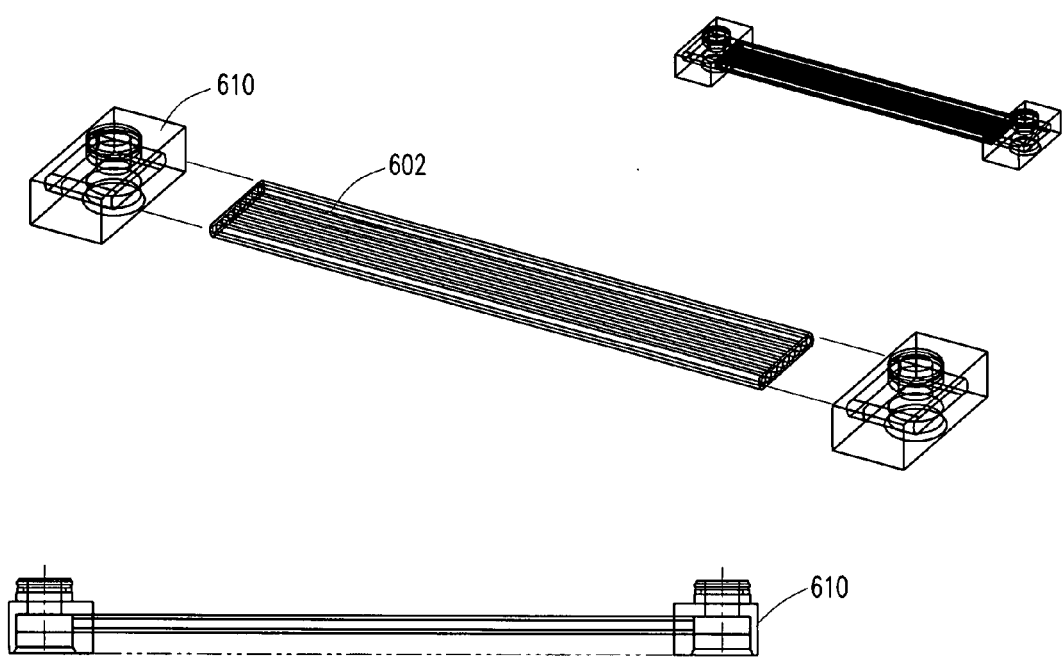
FIG. 18 is a perspective diagrammatic view of the assembly of FIG. 17 and further including one front elevational diagrammatic view showing the flow aspects afforded by the endcaps of one embodiment of the present invention.

Referring now to FIG. 18, there is shown a diagrammatic perspective view of the hot side manifold 602 of FIG. 17 illustrating its assembly with the endcaps 610 and further illustrating the flow regions of the endcaps 610 therewith. A front elevational diagrammatic view of the perspective view of this assembly is also shown on the same page for illustrating the flow channels for the heat transfer fluid flow therewith.

Figure 19:
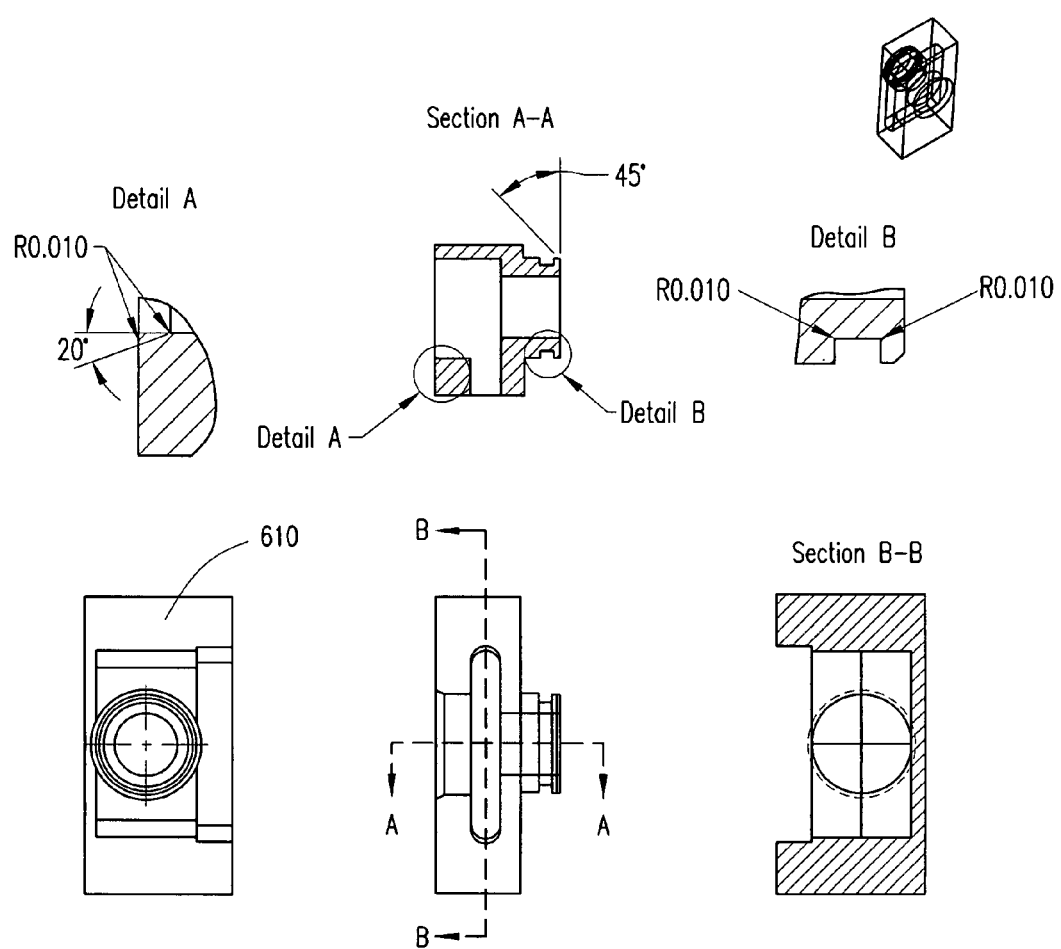
FIG. 19 is a series of engineering views of various aspects of the construction of the endcap of the present invention.

Referring now to FIG. 19, there are shown multiple views of the endcaps 610 of the present invention illustrating the construction thereof. The endcaps 610 are constructed for facilitating flow to and from another set of endcaps in conjunction with the low profile extrusion associated therewith. The heat transfer fluid flowing through the low profile extrusion forming the hot side manifold 602 or 702 as described herein is greatly facilitated by the endcap 610 or 710. It should be noted in the embodiments shown, common reference is made about endcaps 610 and endcaps 710 in view of the fact that they may be of similar or identical construction.

Referring now to FIGS. 15-19, in combination, the use of select flow plugs and the like to control the fluid flow is contemplated in accordance with the principles of the present invention. The use of flow plugs within the ports, channels and orifices of the endcaps 610 will permit directional flow of fluid out of one endcap and into the other and the associated low profile extrusion mounted thereto. For example, flow from the inlet 620 into the uppermost endcap 610 of FIG. 16 is appropriately diverted into the hot side manifold 602. The downward flow out may be selectively blocked by a plug preventing that flow from entering the underlying endcap 610 which is mated therewith. In this manner, the same endcap 610 or 710 can be manufactured for the heat transfer assemblies 600 or 700 as described herein and appropriately plugged or fitted with conventional flow control elements for appropriate flow diversion in a manner that is both expedient and cost-effective. Likewise, the capoff block 722 of FIG. 15 is used to plug the endcap 710 in assembly 700 to prevent the flow of heat transfer fluid from exiting and forcing it through the mating endcap and through hot side manifold 602 downwardly into the underlying heat transfer assemblies. The use of flow plugs, as well as the plumping necessary for such flow connections, should be readily apparent to those skilled in the art, and such plumbing aspects are shown in no greater detail than deemed necessary for practicing the principles of the present invention as set forth and shown herein.

It is believed that the operation and construction of the present invention will be apparent from the foregoing description of a preferred embodiment. While the device shown is described as being preferred, it will be obvious to a person of ordinary skill in the art that various changes and modifications may be made therein without departing from the spirit and scope of the invention as defined in the following claims. Therefore, the spirit and the scope of the appended claims should not be limited to the description of the preferred embodiments contained herein.

The invention claimed is:

1. A stackable heat transfer system for cooling a first heat transfer fluid flowing therethrough with a second heat transfer fluid flowing therein, the system including at least two heat transfer assemblies, coupled one to the other, each assembly comprising:

a first low profile extrusion manifold containing the first fluid therein;

a flow coupling means for receiving and discharging the first fluid into and from the first manifold;

a pair of second low profile extrusion manifolds containing the second fluid therein;

flow control endcaps coupled to the ends of each of the second manifolds and adapted for stacked coupling one to the other in the stacked flow communication therewith;

first and second thermal electric cooler arrays having heat absorption and heat dissipation sides assembled in thermal engagement with the first manifold with the heat absorption side of each cooler array in thermal contact therewith; and means for securing the pair of second manifolds in thermal engagement with the cooler arrays for absorption of heat therefrom with the first manifold sandwiched therebetween.

2. The system as set forth in claim 1 wherein the flow coupling means comprises a conduit adapted for coupling the first manifold of one heat transfer assembly to the first manifold of a second heat transfer assembly stacked therewith.

3. The system of claim 1 wherein the endcap is constructed with generally orthogonal flow channels formed therethrough for selective flow therein.

4. The system as set forth in claim 3 and further including a flow diverting plug adapted for securement within a portion of the orthogonal flow channel of the endcap for selectively restricting flow.

5. The system as set forth in claim 3 wherein the flow channels include a generally cylindrical port in a lower portion thereof.

6. The system as set forth in claim 5 wherein the flow channels include a first slotted portion adapted to receive an end portion of the second manifold therein in flow communication therewith and an upstanding connector adapted for mating engagement with the port of an endcap stacked thereabove.

7. A stackable heat transfer assembly for cooling a first fluid flowing therethrough with a second fluid flowing therein and utilizing thermal electric cooler arrays disposed in a sandwiched configuration therewith, the assembly comprising first and second low profile extrusion manifolds, the first manifold adapted for the flow of the first fluid therein and the second manifold adapted for the flow of the second fluid therethrough;

end caps adapted for mounting to the ends of the second manifold in stacked interconnection one with the other for facilitating a select flow of the second fluid through the second manifolds relative to the sandwiched cooler arrays disposed therein; and means for mounting a pair of second manifolds on opposite sides of the first manifold with a pair of cooler arrays sandwiched therebetween, the cooler arrays oriented so that each cooler array absorbs heat from the first manifold and dissipates heat into the second manifolds, the second manifolds facilitating the flow of the second fluid therethrough and through the end caps interconnected therewith wherein multiple assemblies of sandwiched first and second manifolds and cooler arrays disposed therebetween may be coupled one to the other for affording an increase in heat transfer dissipation from the first fluid flowing therethrough by the second fluid flowing therein.

8. The assembly as set forth in claim 7 and further including at least one conduit adapted for coupling the first manifold of one heat transfer assembly to the first manifold of a second heat transfer assembly stacked therewith.

9. The assembly as set forth in claim 7 and further including a flow diverting plug adapted for securement within a portion of the endcap for selectively diverting flow therethrough.

10. The system as set forth in claim 7 wherein the endcap is constructed with generally orthogonal flow channels formed therethrough.

11. The system as set forth in claim 10 wherein a lower portion of the flow channel includes a port.

12. The system as set forth in claim 11 wherein the orthogonal flow channels of the endcap include a first slotted portion adapted to receive an end portion of the second manifold therein in flow communication therewith and an upstanding connector portion adapted for mating engagement with the port of an endcap stacked therewith.

\* \* \* \* \*